(12) United States Patent
Gotoh et al.

(10) Patent No.: US 6,433,407 B2
(45) Date of Patent: Aug. 13, 2002

(54) SEMICONDUCTOR INTEGRATED CIRCUIT

(75) Inventors: Kunihiko Gotoh; Katsuaki Aizawa; Kazuhiro Kitani; Masatake Kusakari, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/801,669

(22) Filed: Mar. 9, 2001

(30) Foreign Application Priority Data

Jun. 12, 2000 (JP) ........................................ 2000-176041

(51) Int. Cl.[7] .............................................. H01L 29/00

(52) U.S. Cl. ........................ 257/545; 257/173; 257/175

(58) Field of Search ................................ 257/141, 146, 257/157, 173, 175, 361, 362

(56) References Cited

U.S. PATENT DOCUMENTS 5,576,557 A * 11/1996 Ker et al. .................... 257/173

* cited by examiner

*Primary Examiner*—Hoai V. Ho
*Assistant Examiner*—Mai-Huong Tran
(74) *Attorney, Agent, or Firm*—Arent Fox Kintner Plotkin & Kahn

(57) ABSTRACT

A protection circuit in a semiconductor integrated circuit having a master slice I/O circuit comprises an internal circuit, a pad, and a desired number of protection elements connected in parallel between the internal circuit and the pad. Each protection element includes a P-channel MOS transistor which outputs a first power supply voltage level signal on the basis of an output signal of the internal circuit, a N-channel MOS transistor which outputs a second power supply voltage level signal on the basis of the output signal of the internal circuit, a resistor connected between a signal line connected to the pad and an output terminal of the P-channel MOS transistor, and a resistor connected between the signal line and an output terminal of the N-channel MOS transistor.

32 Claims, 24 Drawing Sheets

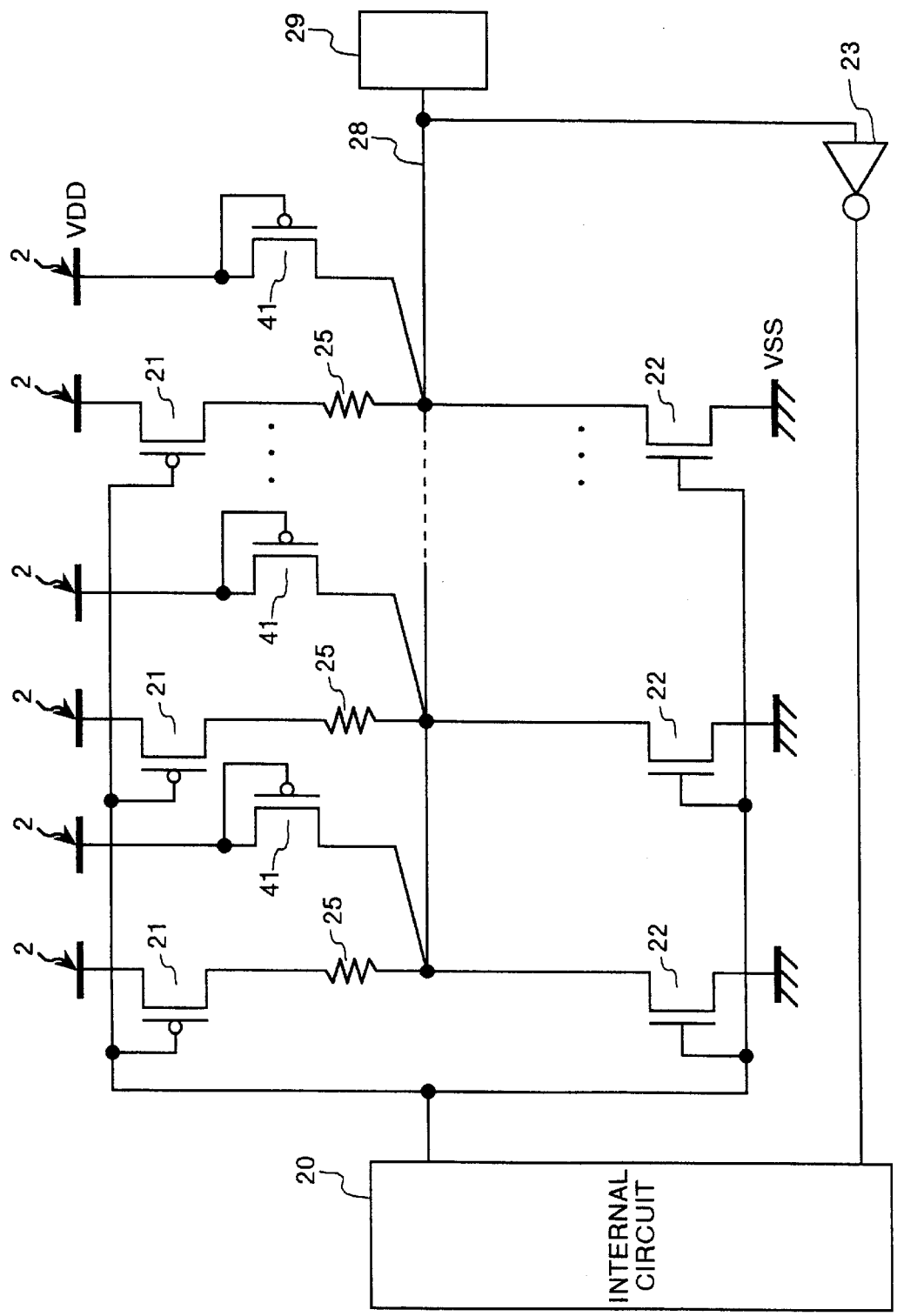

SEMICONDUCTOR INTEGRATED CIRCUIT

FIELD OF THE INVENTION

The present invention in general relates to a semiconductor integrated circuit device (hereafter, semiconductor integrated circuit). More particularly, this invention relates to a technology effectively applicable to an I/O circuit of a master slice semiconductor integrated circuit.

BACKGROUND OF THE INVENTION

In general, a semiconductor integrated circuit comprising a CMOS is provided with a protection circuit for protecting an I/O circuit from an electrostatic breakdown. When the protection circuit is composed of a CMOS transistor, there is a possibility that a MOS transistor of the protection circuit is broken down by a static electricity. For this reason, an element for protecting the MOS transistor of the protection circuit is further required.

FIG. 1 is a circuit diagram showing an I/O circuit including a conventional protection circuit. The I/O circuit is composed of a P-channel MOS transistor 11, an N-channel MOS transistor 12 and an input buffer 13. An output signal of an internal circuit 10 is supplied to a gate of the P-channel MOS transistor 11 and a gate of the N-channel MOS transistor 12.

A drain of the P-channel MOS transistor 11 and a drain of the N-channel MOS transistor 12 are connected in common to a pad 19 via a signal line 18. A first power supply voltage VDD and a second power supply voltage VSS (VSS<VDD) are applied to a source of the P-channel MOS transistor 11 and a source of the N-channel MOS transistor 12, respectively. An input terminal and an output terminal of the input buffer 13 are connected to the pad 19 and the internal circuit 10, respectively.

The following is a description on an operation of the I/O circuit having a configuration shown in FIG. 1. For example, the first power supply voltage VDD is set as a reference voltage, and an excessive high voltage more than the first power supply voltage VDD is applied to the pad 19 by a static electricity or the like. In such a case, a parasitic diode (not shown) of the P-channel MOS transistor 11 and the P-channel MOS transistor 11 both become an on state. For this reason, the inputted excessive high voltage is limited by the first power supply voltage VDD, and then, is inputted to the internal circuit 10.

On the other hand, for example, the second power supply voltage VSS is set as a reference voltage, and a negative excessive high voltage more than the VSS is applied to the pad 19. In such a case, likewise, a parasitic diode (not shown) of the N-channel MOS transistor 12 and the N-channel MOS transistor 12 both become an on state. For this reason, a voltage applied to the internal circuit 10 becomes the second power supply voltage VSS.

As described above, the P-channel MOS transistor 11 and the N-channel MOS transistor 12 are operated as a protection circuit for preventing an excessive voltage more than the first power supply voltage VDD or a negative excessive voltage more than the second power supply voltage VSS from being applied to the internal circuit 10.

Moreover, in the I/O circuit having the configuration shown in FIG. 1, a parasitic resistor (not shown) exists between the signal line 18 connected to the pad 19 and the drain of the P-channel MOS transistor 11 or the drain of the N-channel MOS transistor 12. The parasitic resistor functions as a protection element for preventing an excessive level input voltage from being applied directly to the P-channel MOS transistor 11 and its parasitic diode when a positive excessive voltage more than the first power supply voltage VDD is applied to the pad 19.

When there is no protection element as described above, an excessive level input voltage is applied directly to the P-channel MOS transistor 11 and its parasitic diode, and thereby, a leakage current flows there through; as a result, an IC is deteriorated. The similar disadvantage occurs in when a negative excessive voltage more than the second power supply voltage VSS is applied to the pad 19. Namely, the parasitic resistor prevents an excessive level input voltage from being applied directly to the N-channel MOS transistor 12 and its parasitic diode.

However, in recent years, in order to rapidly achieve a downsizing or high driving performance of IC, a silicide process is employed, and thereby, a parasitic resistance of a source or drain of transistor is suppressed smaller. For this reason, the parasitic resistance is not enough to protect a gate oxide film of the P-channel MOS transistor 11 or N-channel MOS transistor 12.

In a recent I/C circuit, as shown in FIG. 2, resistors 15 and 16 made of the same polysilicon as gate are interposed between the signal line 18 and the drain of the P-channel MOS transistor 11 or the drain of the N-channel MOS transistor 12. These resistors 15 and 16 have about tens of ohm ($\Omega$).

However, in particular, when these resistors 15 and 16 having about tens of ohm are inserted in an I/O circuit having a high driving speed, an output level from the pad 19 changes due to a voltage drop by a current flowing through these resistors 15 and 16. As a result, there is a problem that an output characteristic is deteriorated. For example, in the case of an output circuit, which has resistors 15 and 16 individually having a resistance value of 50 $\Omega$ and flows a output current of 12 mA, a fluctuation of output level by its voltage drop becomes 1.2 V. For this reason, the I/O circuit having the aforesaid protection circuit has disadvantage characteristic in the case of driving another circuit connected thereto.

SUMMARY OF THE INVENTION

It is an object of the present invention to provide a semiconductor integrated circuit, which can effectively prevent a breakdown of a protection transistor of a protection circuit for protecting a breakdown of a gate oxide film by a static electricity or the like, without changing the output circuit characteristics.

The semiconductor integrated circuit according to this invention has a construction as explained below. That is, in a master slice I/O circuit, a protection circuit with respect to an internal circuit is constructed in a manner that a protection element array is composed of a P-channel MOS transistor, a resistor and an N-channel MOS transistor, and a plurality of protection element arrays are arranged in a state of being connectable in parallel. Further, a proper number of protection element arrays are connected in parallel in accordance with a desired driving performance.

FIG. 3 is a circuit diagram that explains the principle of a semiconductor integrated circuit according to the present invention. The semiconductor integrated circuit is a master slice I/O circuit, and has a circuit configuration such that a plurality of protection element arrays 2, 2, . . . are arranged between an internal circuit 20 and a pad 29. In the I/O circuit, in order to obtain a desired driving performance, a wiring connection pattern is modified so that a proper number of protection element arrays 2, 2, ... are connectable in parallel. In FIG. 3, there is shown a state that a proper number of protection element arrays 2, 2, ... are connected in parallel. In FIG. 3, a reference numeral 23 denotes an input buffer.

Each protection element array 2 has the same configuration. The protection element array 2 includes a P-channel MOS transistor 21, two resistors 25 and 26 and an N-channel MOS transistor 22. A source of the P-channel MOS transistor 21 is connected to a first power supply voltage terminal supplying a first power supply voltage VDD. A gate of the P-channel MOS transistor 21 is connected to an output terminal of the internal circuit 20. A drain of the P-channel MOS transistor 21 is connected to one terminal of the first resistor 25.

The other terminal of the first resistor 25 is connected to a signal line 28 connected to the pad 29 and one terminal of the second resistor 26. The other terminal of the second resistor 26 is connected to a drain of the N-channel MOS transistor 22. A gate of the N-channel MOS transistor 22 is connected in common to the output terminal of the internal circuit 20 together with the gate of the P-channel MOS transistor 21. A source of the N-channel MOS transistor 22 is connected to a second power supply terminal supplying a second power supply voltage VSS (VSS<VDD).

The first resistor 25 and second resistor 26 may be a diffusion resistor formed on a semiconductor substrate, may be a resistor made of polysilicon, or may be a well resistor formed on a semiconductor substrate. Moreover, all protection element arrays 2, the internal circuit 20 and the pad 29 are formed on the identical semiconductor substrate.

In the semiconductor integrated circuit of the present invention, a wiring pattern is modified, and thereby, it is possible to obtain an I/O circuit having the aforesaid configuration. Therefore, according to the present invention, a proper number of protection element arrays 2, 2, ... are connected in parallel, and thereby, it is possible to obtain a desired driving performance.

When a positive excessive high voltage is applied to the pad 29 by a static electricity or the like, a voltage drop is made by the resistor 25; therefore, a voltage lower than an input voltage level is applied to the P-channel MOS transistor 21. Likewise, when a negative excessive high voltage is applied to the pad 29 by a static electricity or the like, a voltage drop is made by the resistor 26; therefore, a voltage lower than an input voltage level is applied to the N-channel MOS transistor 22. Accordingly, it is possible to securely prevent a breakdown of MOS transistors 21 and 22 included in each protection element array 2.

Moreover, a plurality of protection element arrays 2, 2, ... are connected in parallel, and thereby, even if the resistors 25 and 26 of each protection element array 2 have a resistance value enough to prevent a breakdown of the MOS transistors 21 and 22, the protection circuit has a small resistance value as a whole. Accordingly, it is possible to prevent a fluctuation of the output level from the pad 29, and thereby, there is no deterioration in its output characteristics.

Other objects and features of this invention will become apparent from the following description with reference to the accompanying drawings.

BRIEF DESCRIPTION OF THE DRAWINGS

FIG. 24 is a circuit diagram showing an eighth modification example of the third embodiment.

DESCRIPTION OF THE PREFERRED EMBODIMENTS

Preferred embodiments of a semiconductor integrated circuit according to the of the present invention will be described below with reference to the accompanying drawings.

Figure 1:
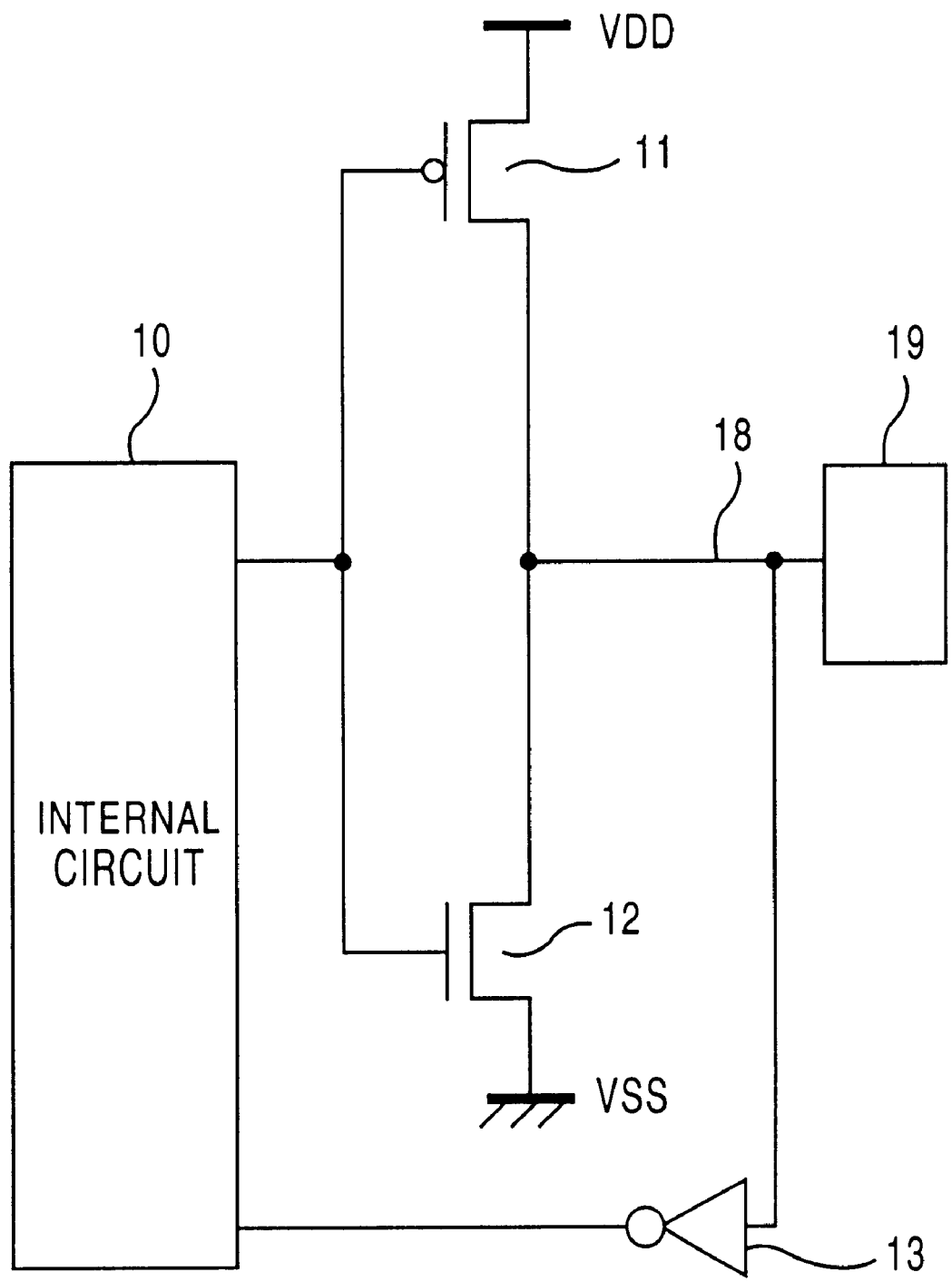
FIG. 1 is a circuit diagram showing a conventional I/O circuit including a protection circuit.
Figure 2:
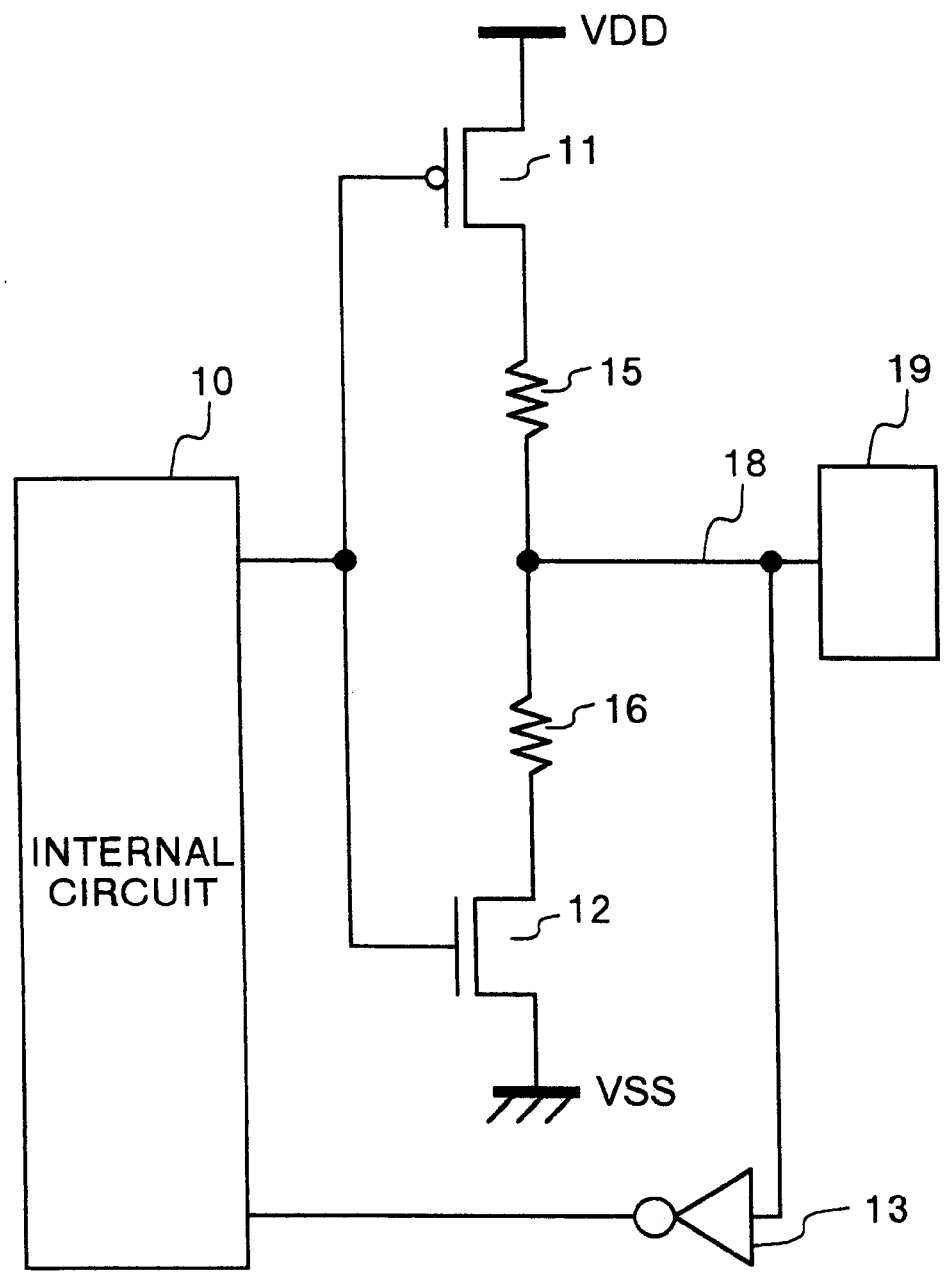
FIG. 2 is a circuit diagram showing a conventional I/O circuit including a protection circuit.
Figure 3:
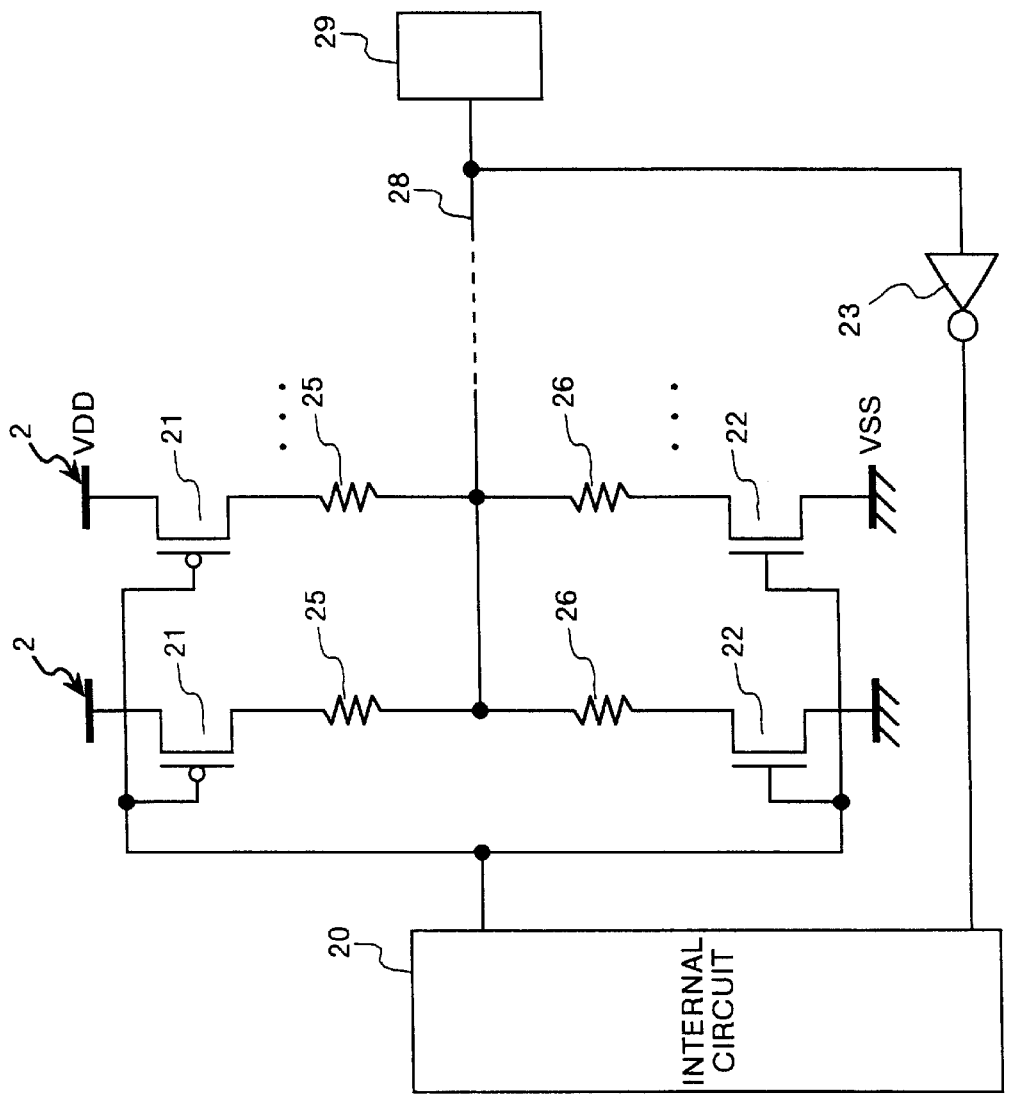
FIG. 3 is a circuit diagram showing the principle of a semiconductor integrated circuit according to the present invention.
Figure 4:
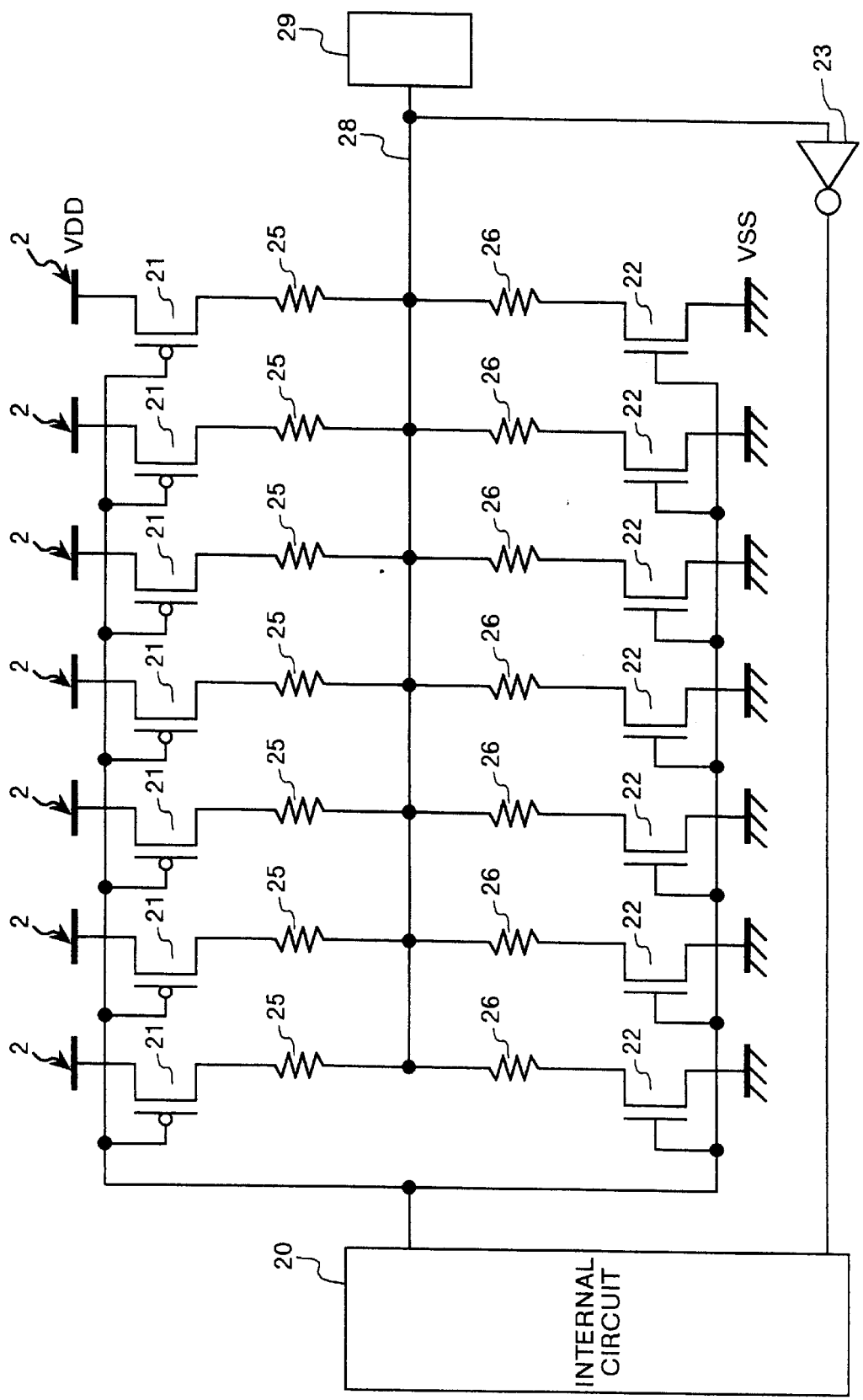
FIG. 4 is a circuit diagram showing a semiconductor integrated circuit according to a first embodiment of the present invention.

FIG. 4 is a circuit diagram showing a semiconductor integrated circuit according to a first embodiment of the present invention. A master slice I/O circuit is constructed in a manner that seven protection element arrays 2 are connected in parallel. In other words, the semiconductor integrated circuit includes seven or more protection element arrays mutually connectable in parallel. The detailed configuration of the semiconductor integrated circuit is the same as the principle configuration described in FIG. 3; therefore, like reference numerals are used to designate the same components as FIG. 3, and their overlapping explanation are omitted.

FIG. 4 shows a state that seven protection element arrays 2 have been already connected in parallel by wiring. In FIG. 4, when eight or more protection element arrays 2 have been previously provided, no reminder protection element array is shown therein.

According to the first embodiment, the semiconductor integrated circuit is constructed in a manner that a wiring pattern is modified in accordance with a desired driving performance, and thereby, seven protection element arrays 2, 2, . . . are connected in parallel. Thus, seven protection element arrays 2, 2, . . . are connected in parallel, and thereby, the first resistor 25 and the second resistor 26 are connected in parallel seven to each.

Thus, even if these resistors 25 and 26 of each protection element array 2 individually have a resistance value enough to prevent a breakdown of the MOS transistors 21 and 22 of each protection element array 2, the protection circuit has a resistance value of 1/7 of the first resistor 25 or second resistor 26. Therefore, it is possible to prevent a breakdown of the MOS transistors 21 and 22 constituting each protection element array 2 without deteriorating output characteristic to the outside.

The present invention is not limited to the above first embodiment, and various modifications are possible. For example, in each protection element array 2, as shown in FIG. 5, only resistor 26 may be interposed between the N-channel MOS transistor 22 and the signal line 28, or as shown in FIG. 6, only resistor 25 may be interposed between the P-channel MOS transistor 21 and the signal line 28.

Figure 5:
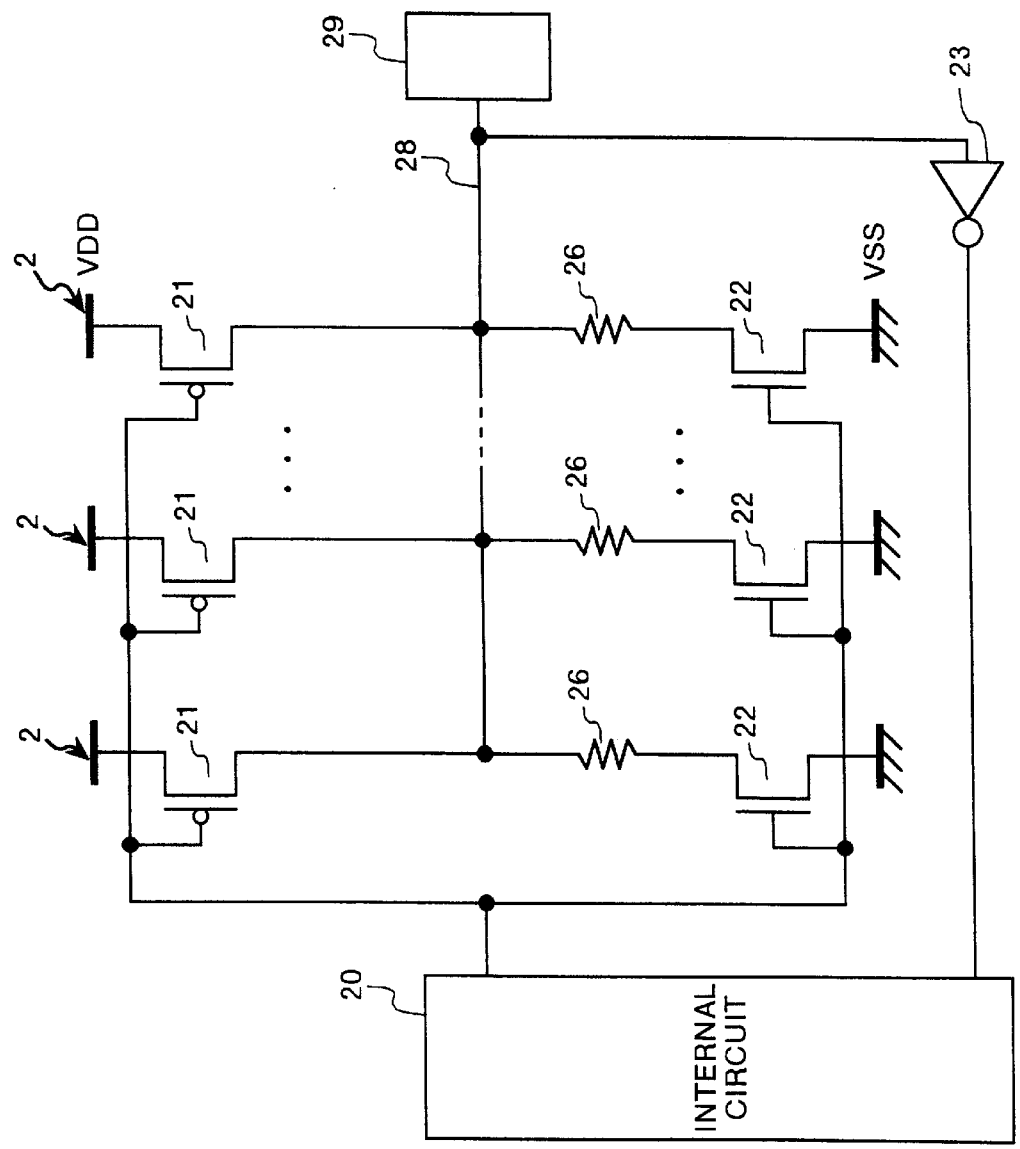
FIG. 5 is a circuit diagram showing a first modification example of the first embodiment.
Figure 6:
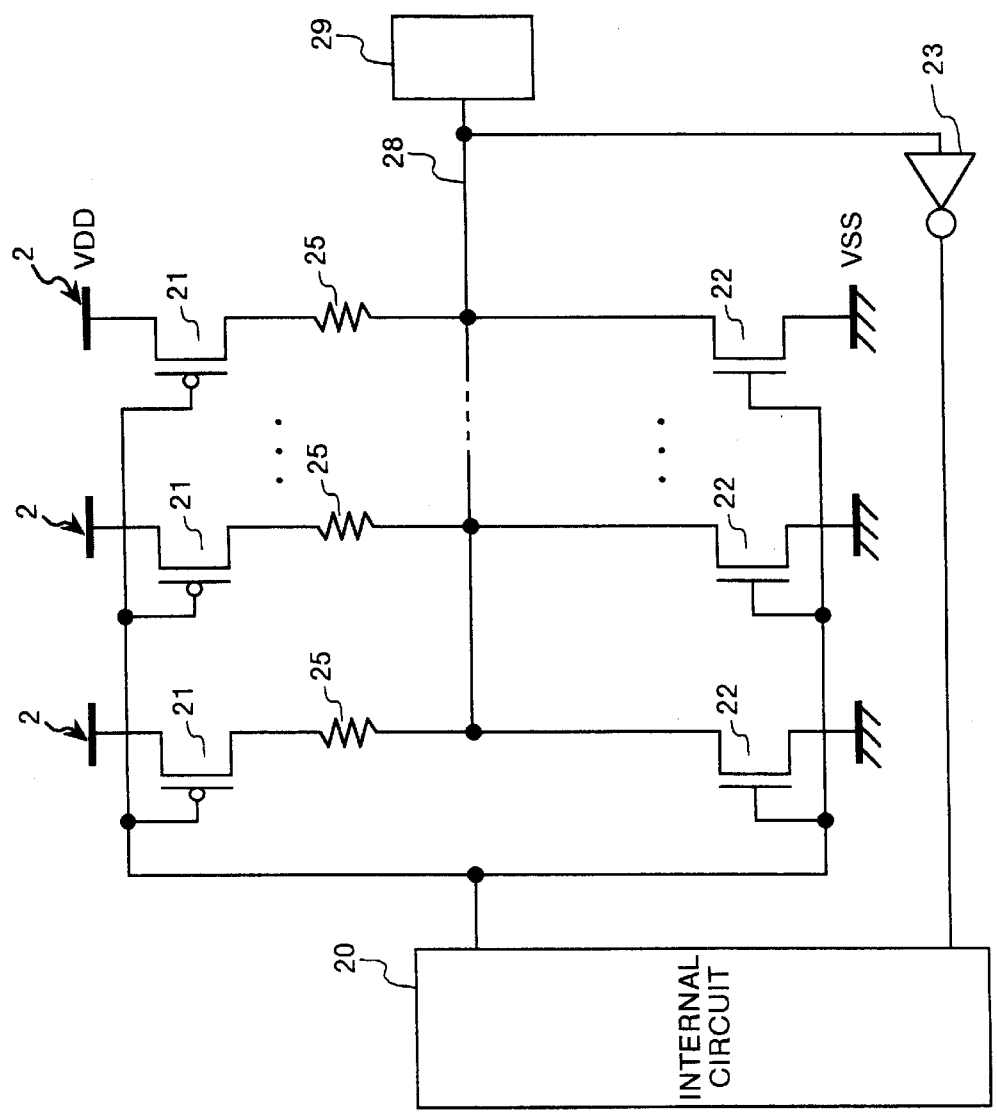
FIG. 6 is a circuit diagram showing a second modification example of the first embodiment.

The I/O circuit having the configuration as shown in FIG. 5 is effective when the N-channel MOS transistor 22 is liable to be broken down by application of a negative excessive high voltage. Moreover, the I/O circuit having the configuration as shown in FIG. 6 is effective when the P-channel MOS transistor 21 is liable to be broken down by application of a positive excessive high voltage.

Figure 7:
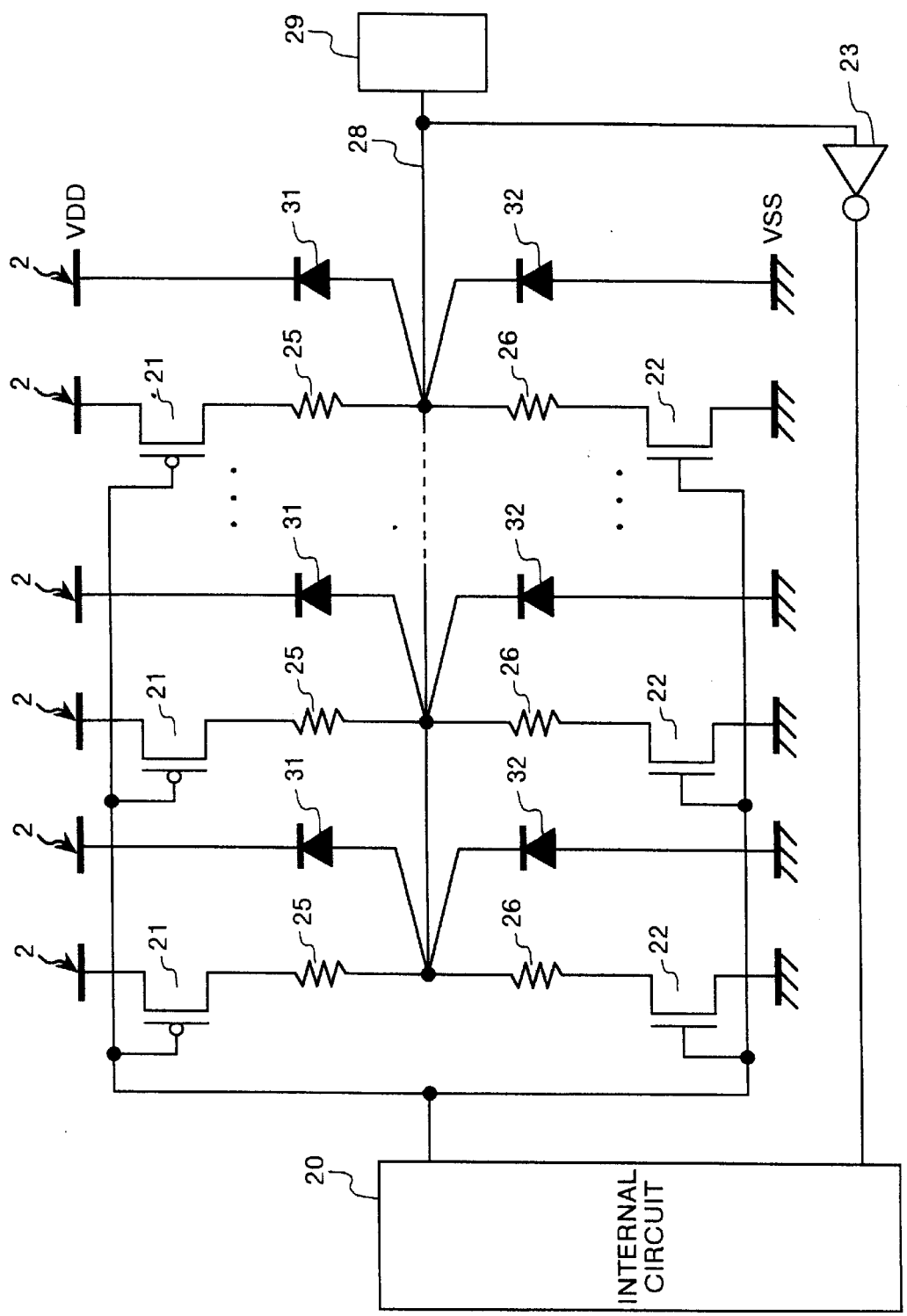
FIG. 7 is a circuit diagram showing a semiconductor integrated circuit according to a second embodiment of the present invention.

FIG. 7 is a circuit diagram showing a semiconductor integrated circuit according to a second embodiment of the present invention. As shown in FIG. 7, according to this second embodiment, a current path comprising two P-N junction diodes (hereinafter, referred to as diode) 31 and 32 is added to each protection element array 2 in the first embodiment shown in FIG. 4. Other configuration is the same as the above first embodiment; therefore, like reference numerals are used to designate the same components as the first embodiment, and the details are omitted.

In each protection element array 2, an anode terminal of the first diode 31 is connected to a connection point between the protection element array 2 and the signal line 28. A cathode terminal of the first diode 31 is connected to a first power supply voltage terminal supplying a first power supply voltage VDD. Moreover, an anode terminal of the second diode 32 is connected to a second power supply voltage terminal supplying a second power supply voltage VSS. A cathode terminal of the second diode 32 is connected to a connection point between the protection element array 2 and the signal line 28. These first and second diodes 31 and 32 are formed on the same semiconductor substrate as the internal circuit 20, the protection element array 2 or the like.

According to the second embodiment, when a positive excessive high voltage is applied to the pad 29, a current flows through the first diode 31. On the other hand, when a negative excessive high voltage is applied to the pad 29, a current flows through the second diode 32. Therefore, it is possible to more effectively prevent a breakdown of the MOS transistors 21 and 22 constituting each protection element array 2, as compared with the above first embodiment.

Figure 8:
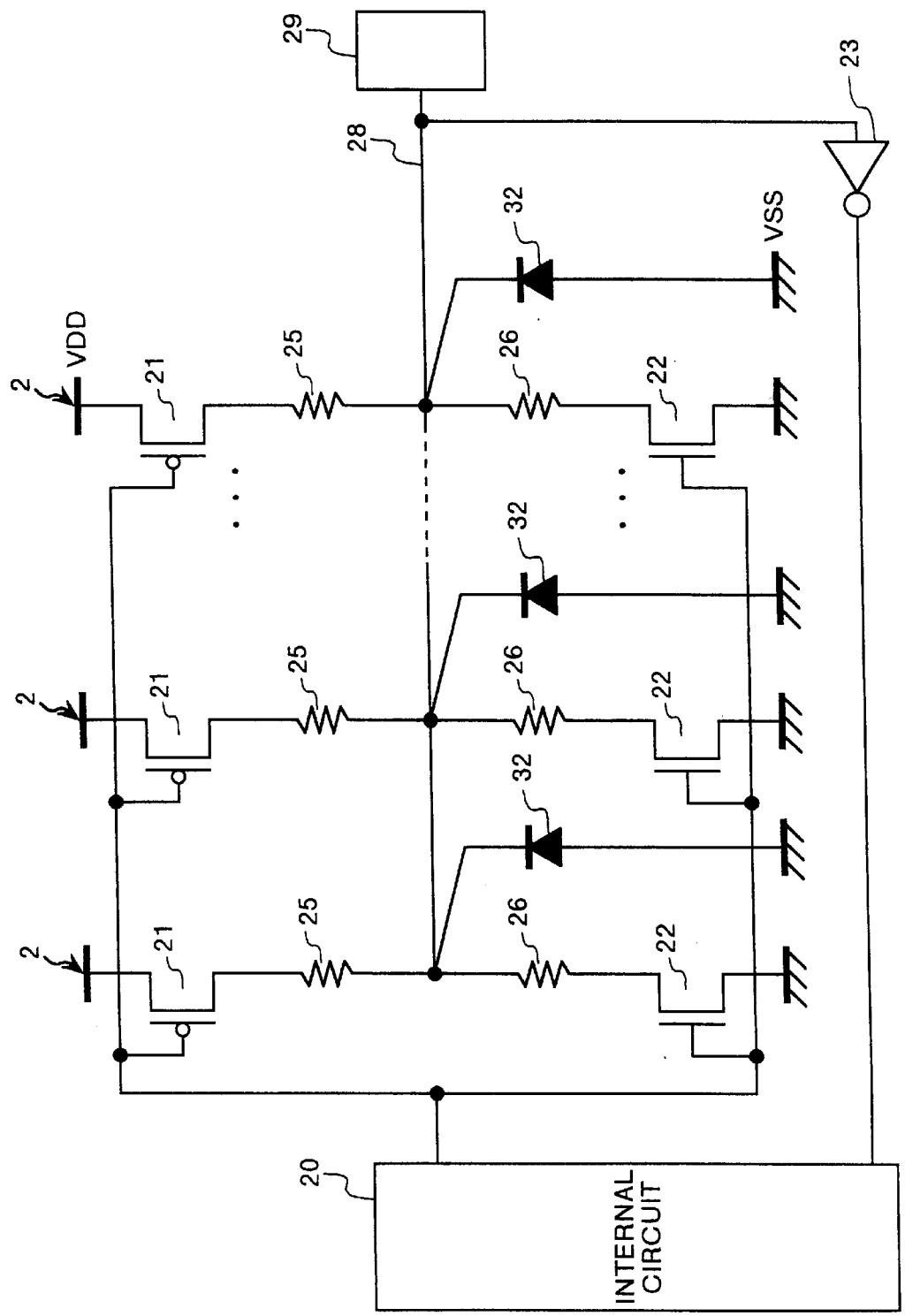
FIG. 8 is a circuit diagram showing a first modification example of the second embodiment.
Figure 9:
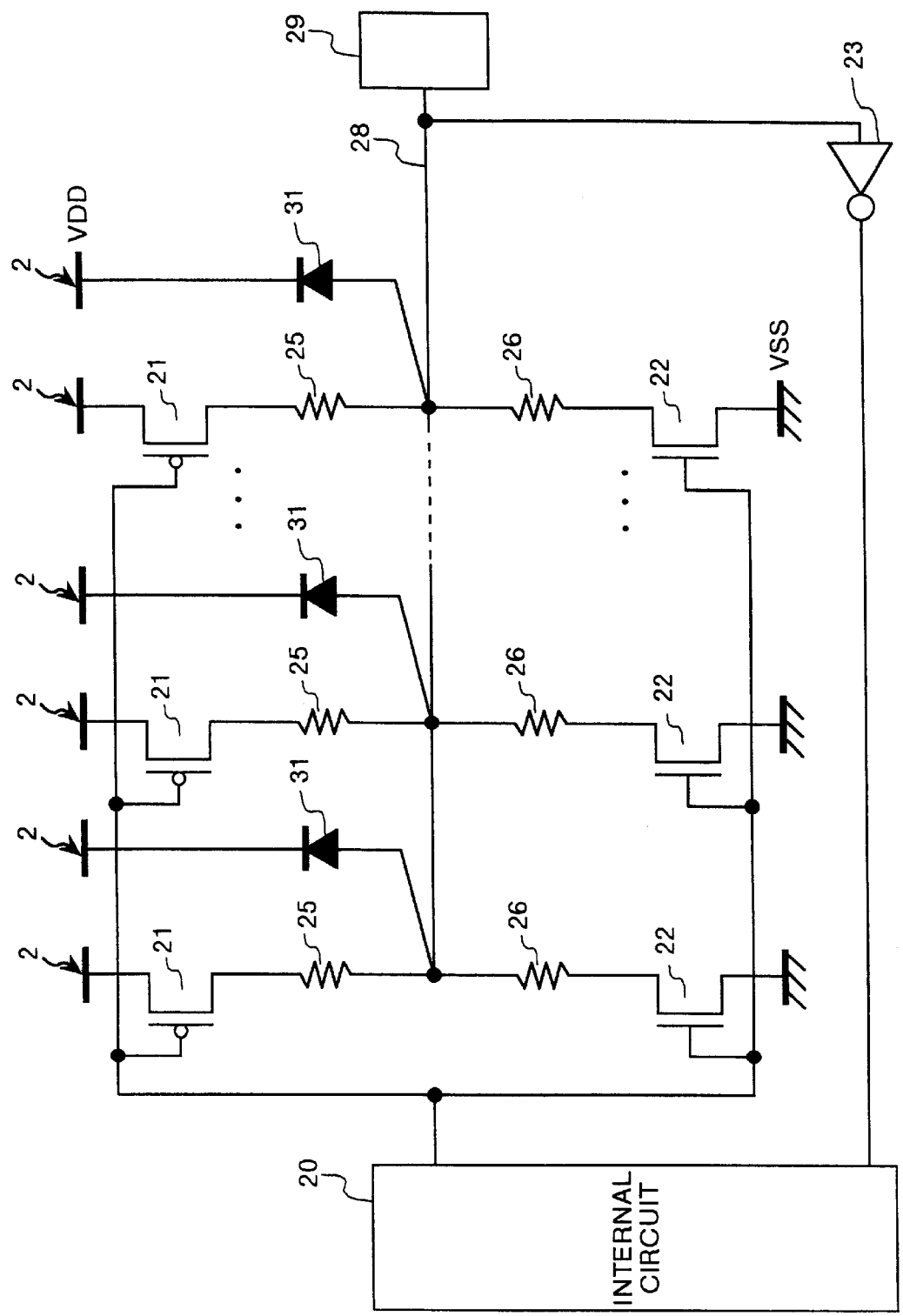
FIG. 9 is a circuit diagram showing a second modification example of the second embodiment.
Figure 10:
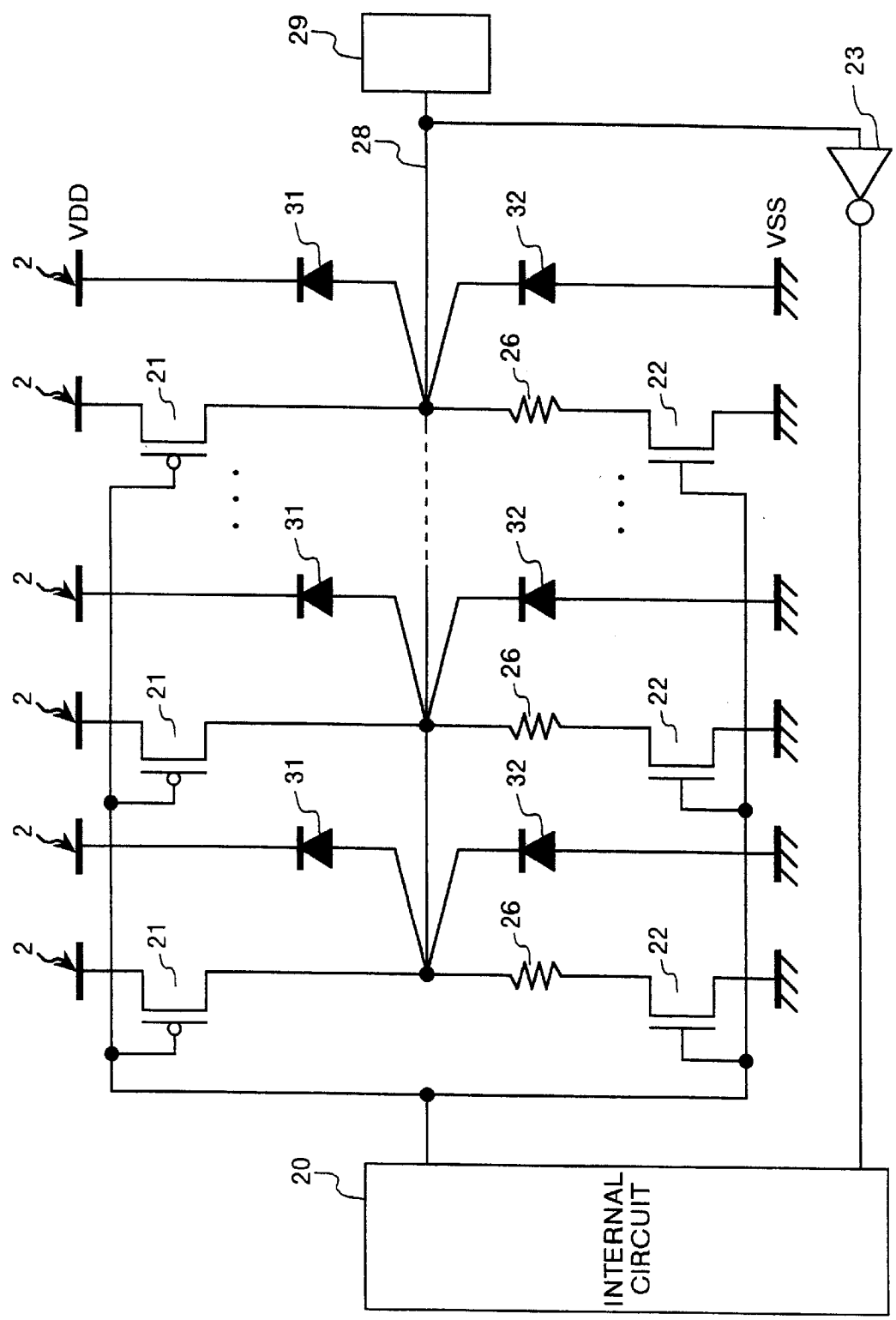
FIG. 10 is a circuit diagram showing a third modification example of the second embodiment.
Figure 11:
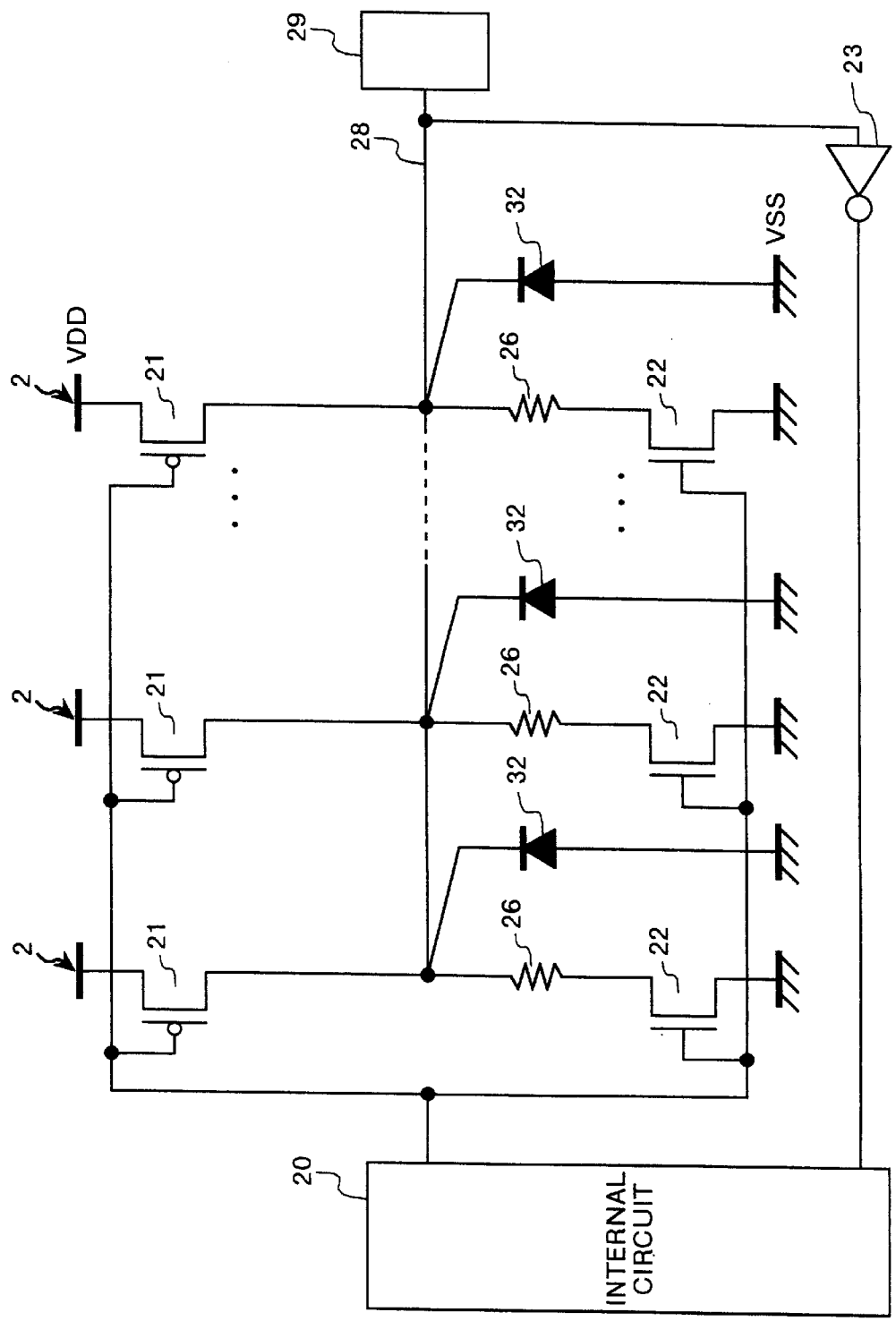
FIG. 11 is a circuit diagram showing a fourth modification example of the second embodiment.
Figure 12:
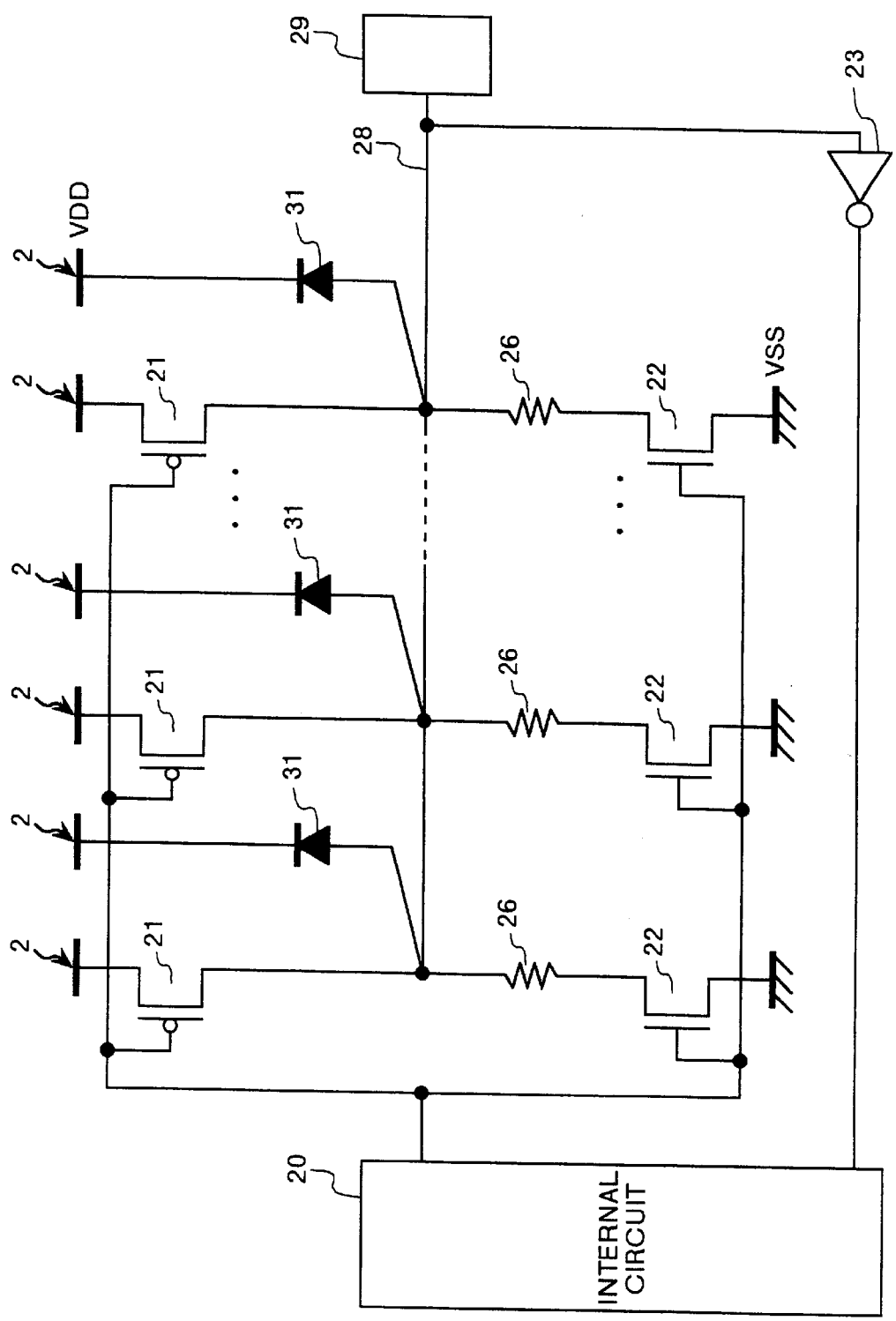
FIG. 12 is a circuit diagram showing a fifth modification example of the second embodiment.

In each protection element array 2, as shown in FIG. 8, the diode 32 may be provided on only N-channel MOS transistor 22 side, or as shown in FIG. 9, the diode 31 may be provided on only P-channel MOS transistor 21 side. Moreover, in the protection element array 2 having a configuration that only resistor 26 is provided on the N-channel MOS transistor 22 side, as shown in FIG. 10, the first and second diodes 31 and 32 may be added thereto. Further, as shown in FIG. 11, the diodes 32 may be provided on only N-channel MOS transistor 22 side. Furthermore, as shown in FIG. 12, the diodes 31 may be provided on only P-channel MOS transistor 21 side.

Figure 13:
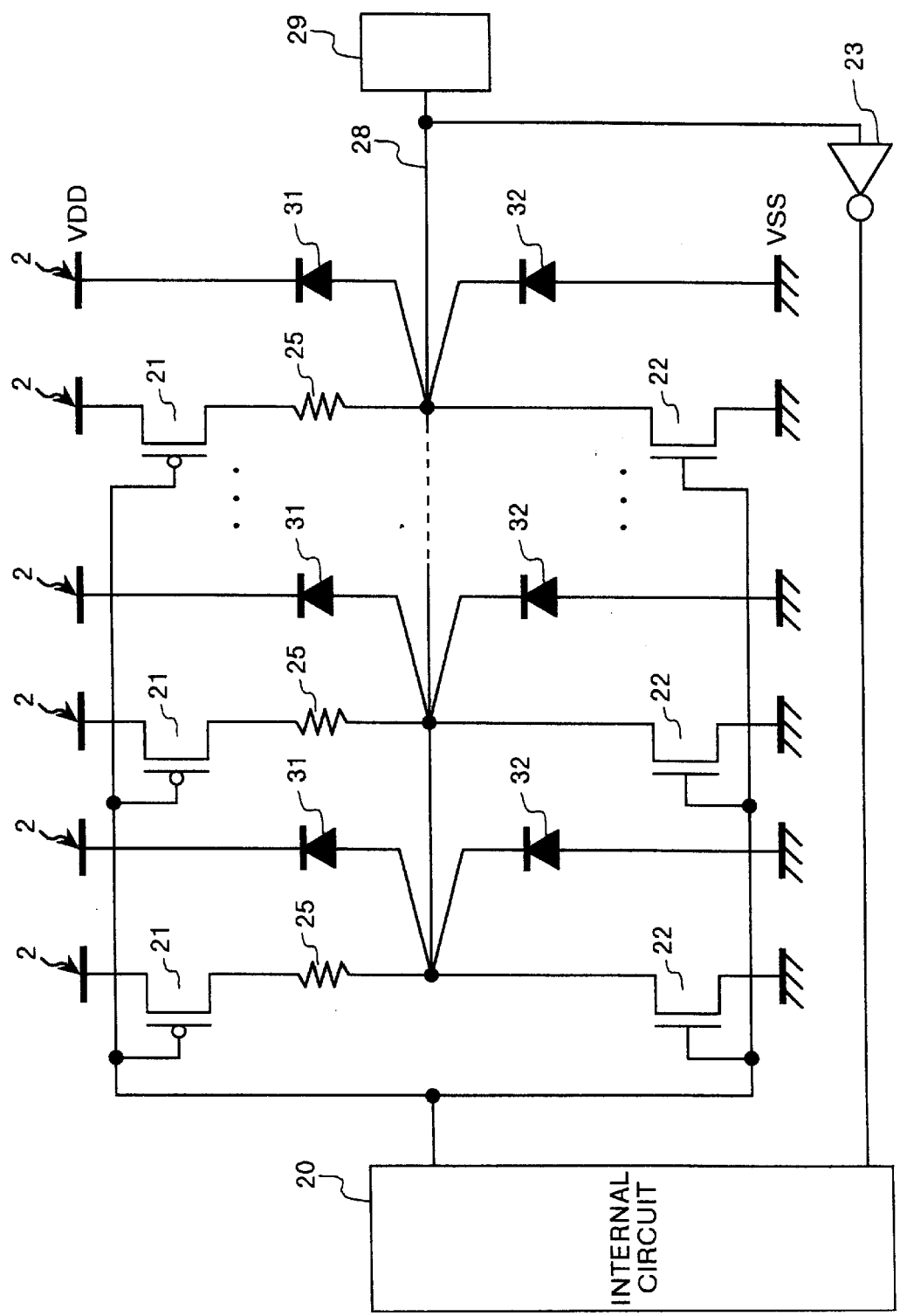
FIG. 13 is a circuit diagram showing a sixth modification example of the second embodiment.
Figure 14:
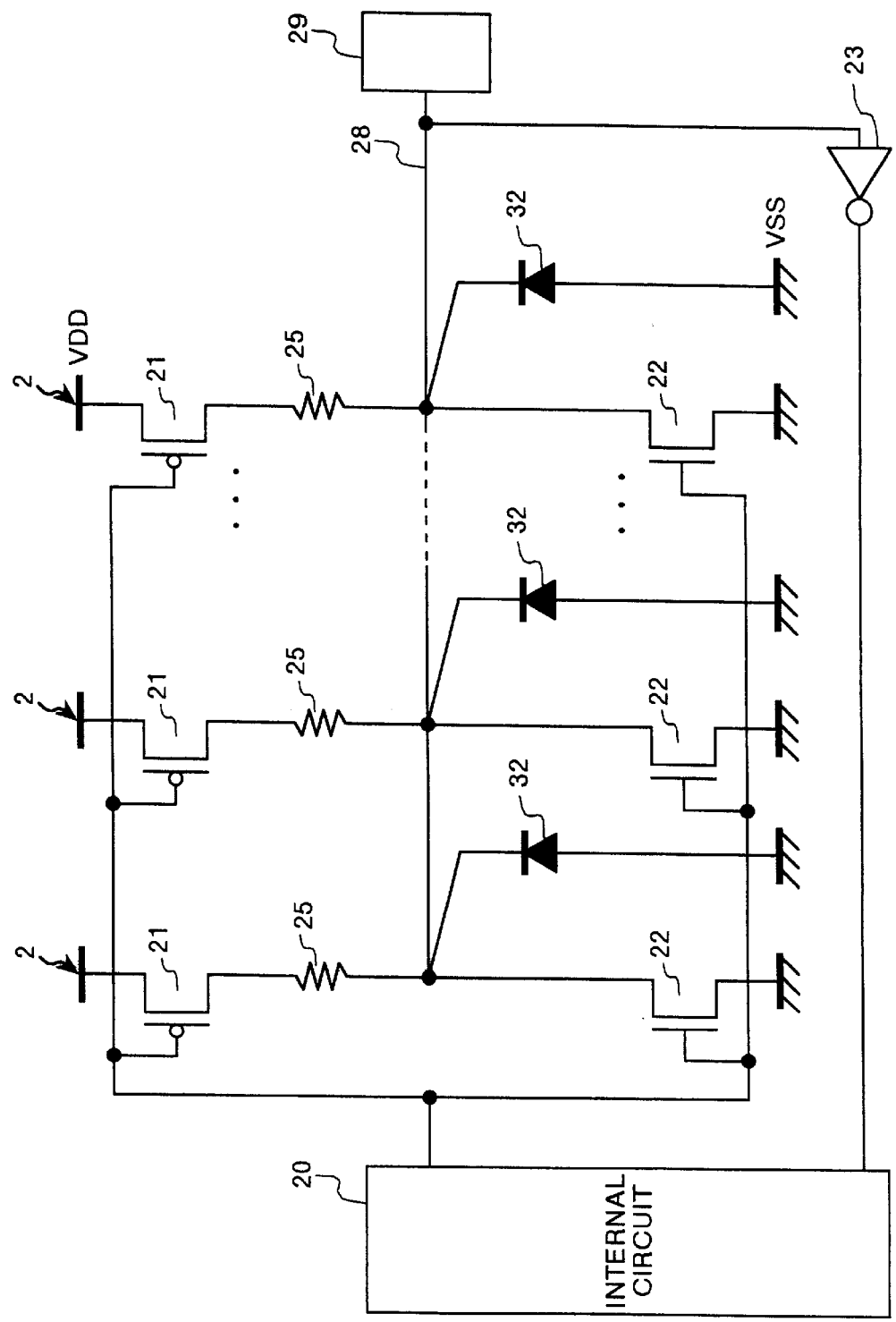
FIG. 14 is a circuit diagram showing a seventh modification example of the second embodiment.
Figure 15:
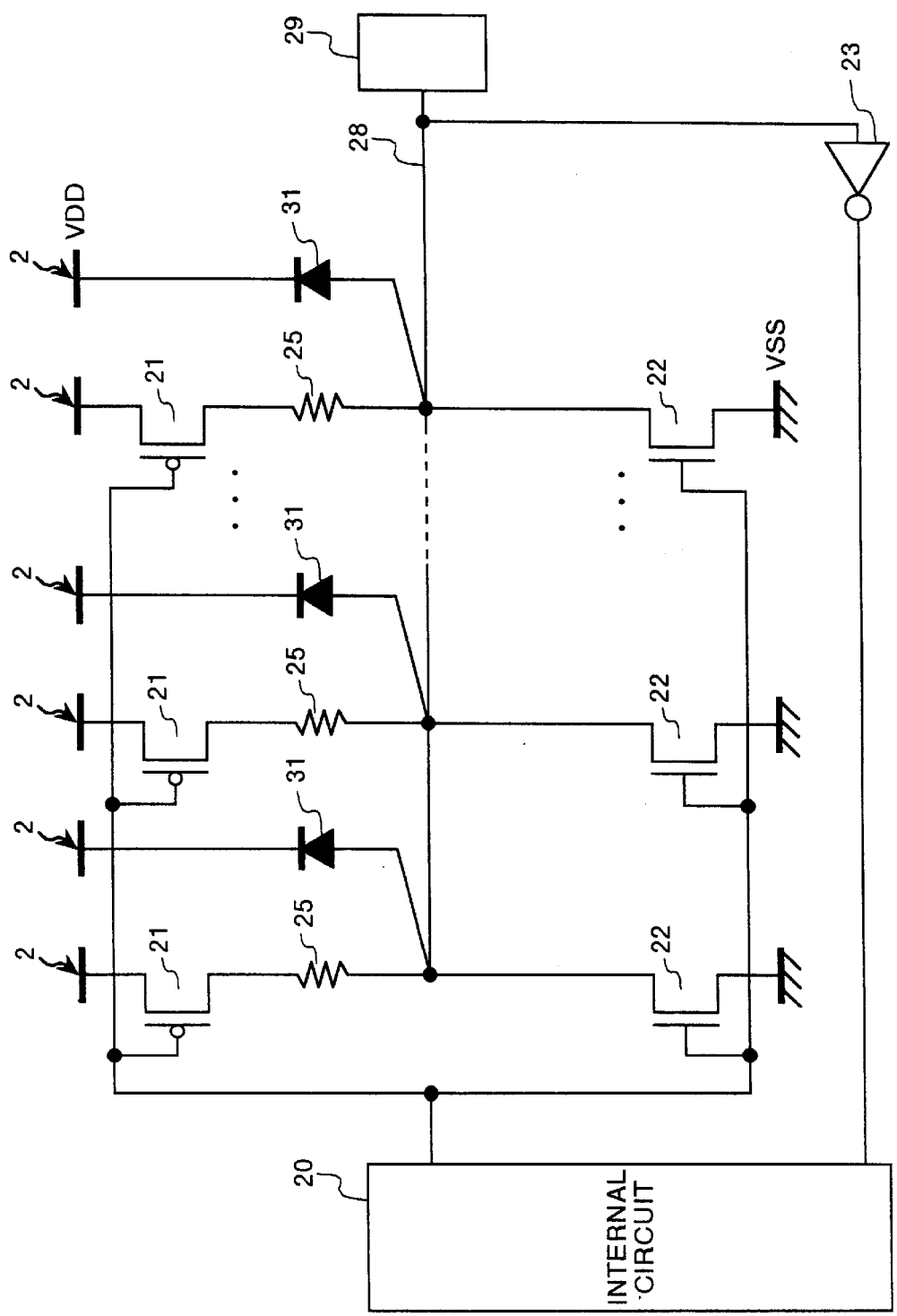
FIG. 15 is a circuit diagram showing an eighth modification example of the second embodiment.

Likewise, in the protection element array 2 having a configuration that only resistor 25 is provided on the P-channel MOS transistor 21 side, as shown in FIG. 13, the first and second diodes 31 and 32 may be added thereto. Further, as shown in FIG. 14, the diodes 32 may be provided on only N-channel MOS transistor 22 side. Furthermore, as shown in FIG. 15, the diodes 31 may be provided on only P-channel MOS transistor 21 side.

Figure 16:
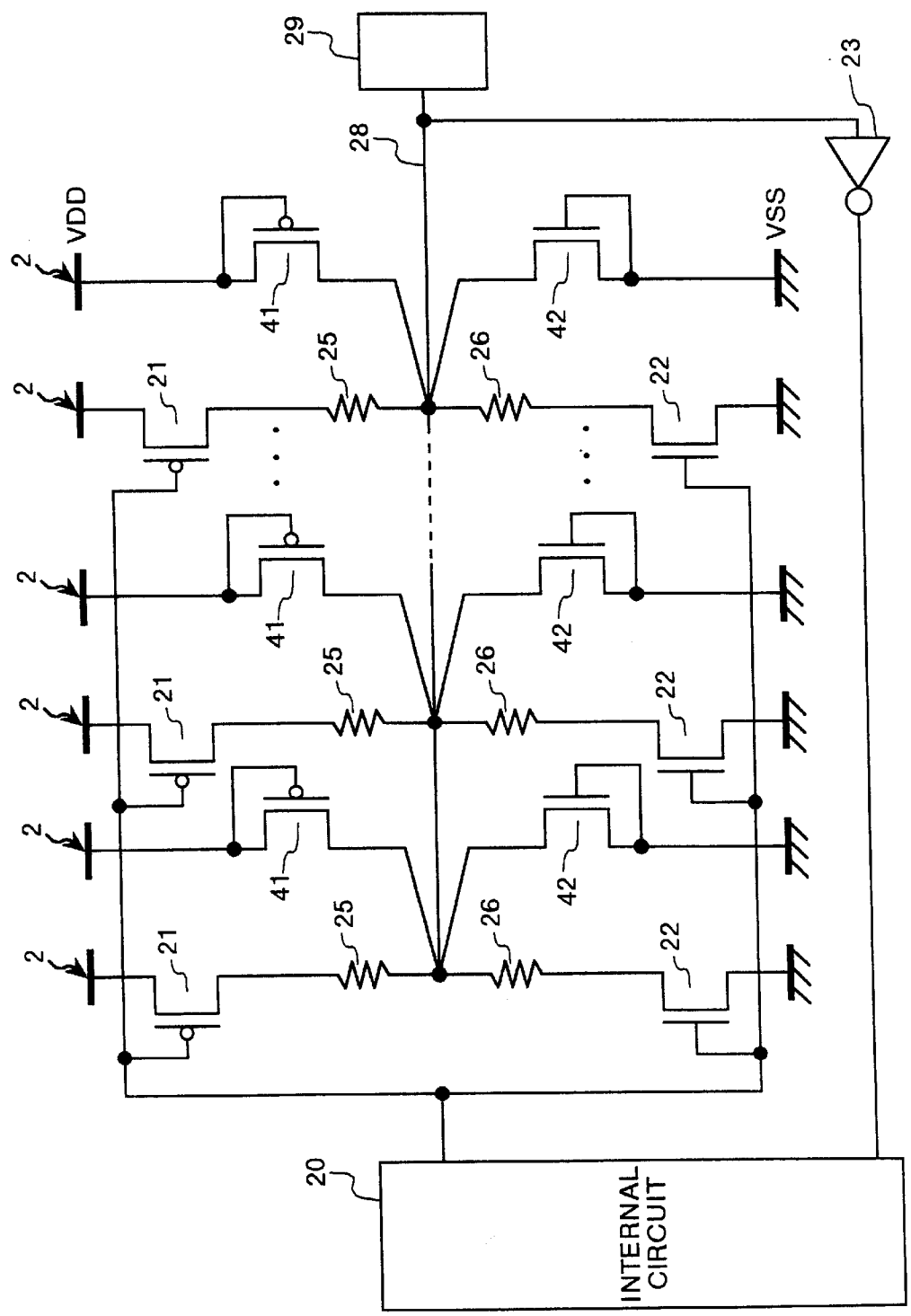
FIG. 16 is a circuit diagram showing a semiconductor integrated circuit according to a third embodiment of the present invention.

FIG. 16 is a circuit diagram showing a semiconductor integrated circuit according to a third embodiment of the present invention. As shown in FIG. 16, according to this third embodiment, a current path comprising two field transistors 41 and 42 is added to each protection element array 2 in the first embodiment shown in FIG. 4. Other configuration is the same as the above first embodiment; therefore, like reference numerals are used to designate the same components as the first embodiment, and the details are omitted.

In each protection element array 2, a drain of the first field transistor 41 is connected to a connection point between the protection element array 2 and the signal line 28. A source of the first field transistor 41 is short-circuited to its gate, and is connected to a first power supply voltage terminal supplying a first power supply voltage VDD.

Moreover, a drain of the second field transistor 42 is connected to a connection point between the protection element array 2 and the signal line 28. A source of the second field transistor 42 is short-circuited to its gate, and is connected to a second power supply voltage terminal supplying a second power supply voltage VSS. These first and second field transistors 41 and 42 are formed on the same semiconductor substrate as the internal circuit 20, the protection element array 2 or the like.

According to the third embodiment, when a positive excessive high voltage is applied to the pad 29, a current flows through the first field transistor 41. On the other hand, when a negative excessive high voltage is applied to the pad 29, a current flows through the second field transistor 42. Therefore, it is possible to more effectively prevent a breakdown of the MOS transistors 21 and 22 constituting each protection element array 2, as compared with the above first embodiment.

Figure 17:
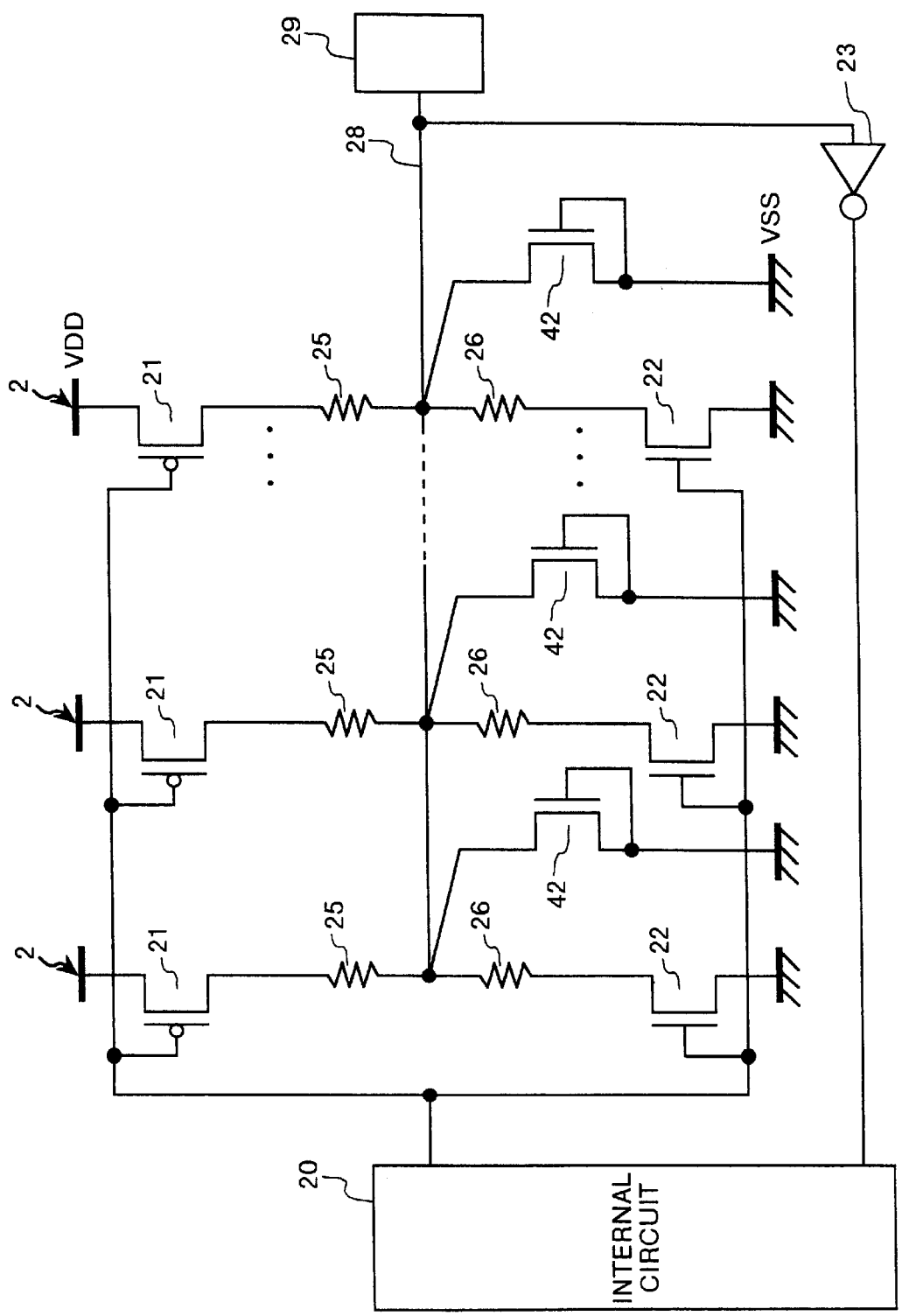
FIG. 17 is a circuit diagram showing a first modification example of the third embodiment.
Figure 18:
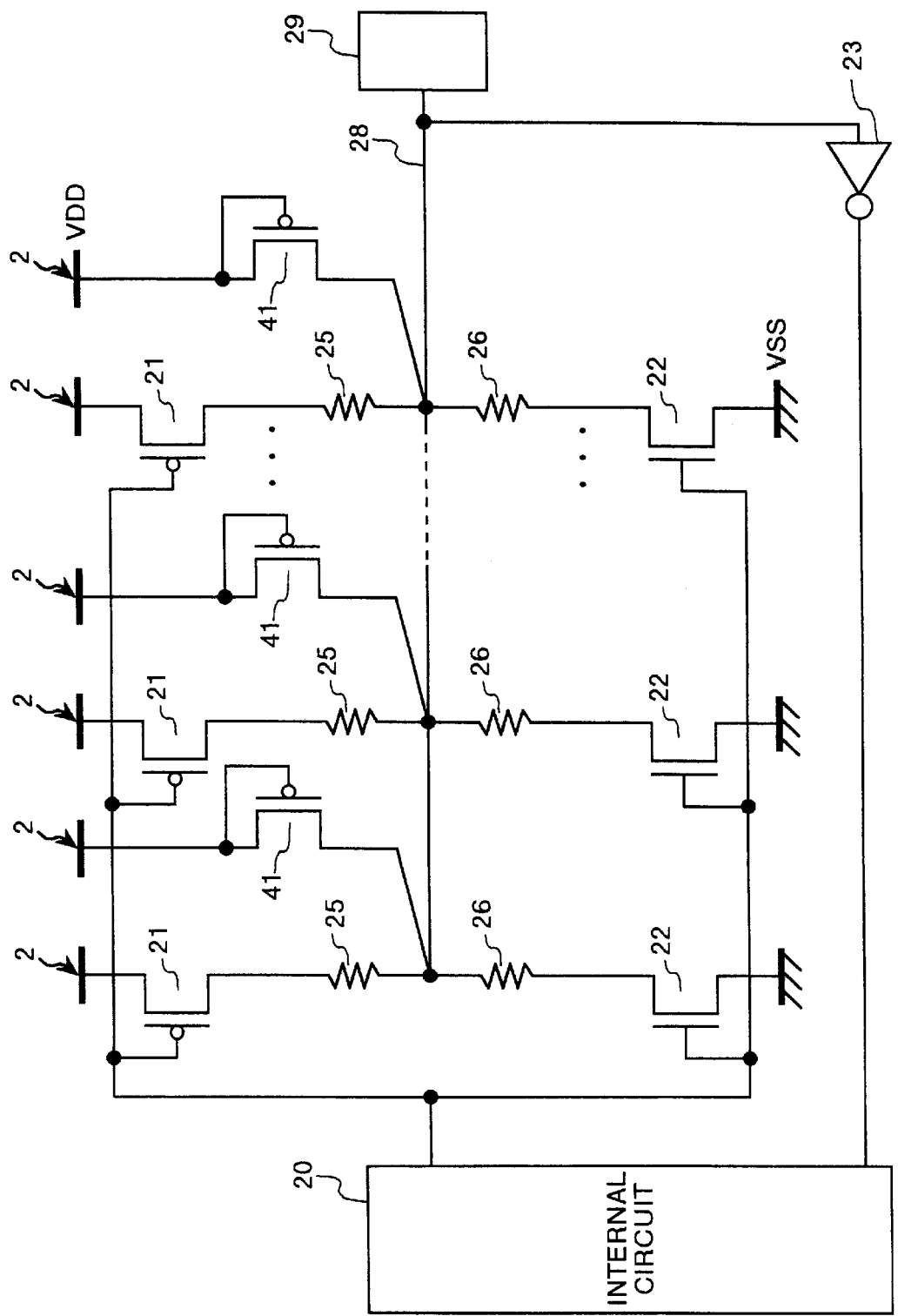
FIG. 18 is a circuit diagram showing a second modification example of the third embodiment.

In each protection element array 2, as shown in FIG. 17, the field transistor 42 may be provided on only N-channel MOS transistor 22 side, or as shown in FIG. 18, the field transistor 41 may be provided on only P-channel MOS transistor 21 side.

Figure 19:
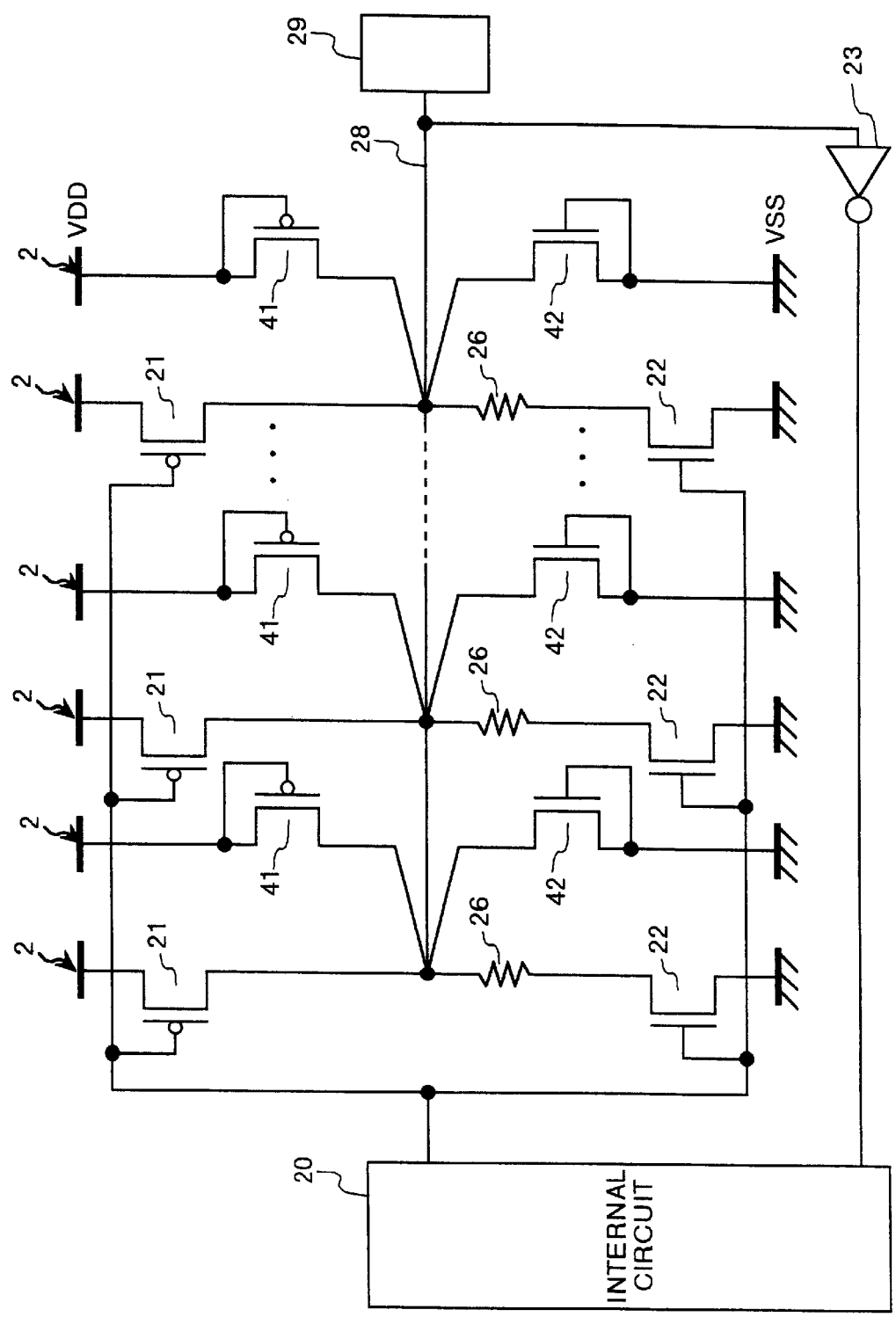
FIG. 19 is a circuit diagram showing a third modification example of the third embodiment.
Figure 20:
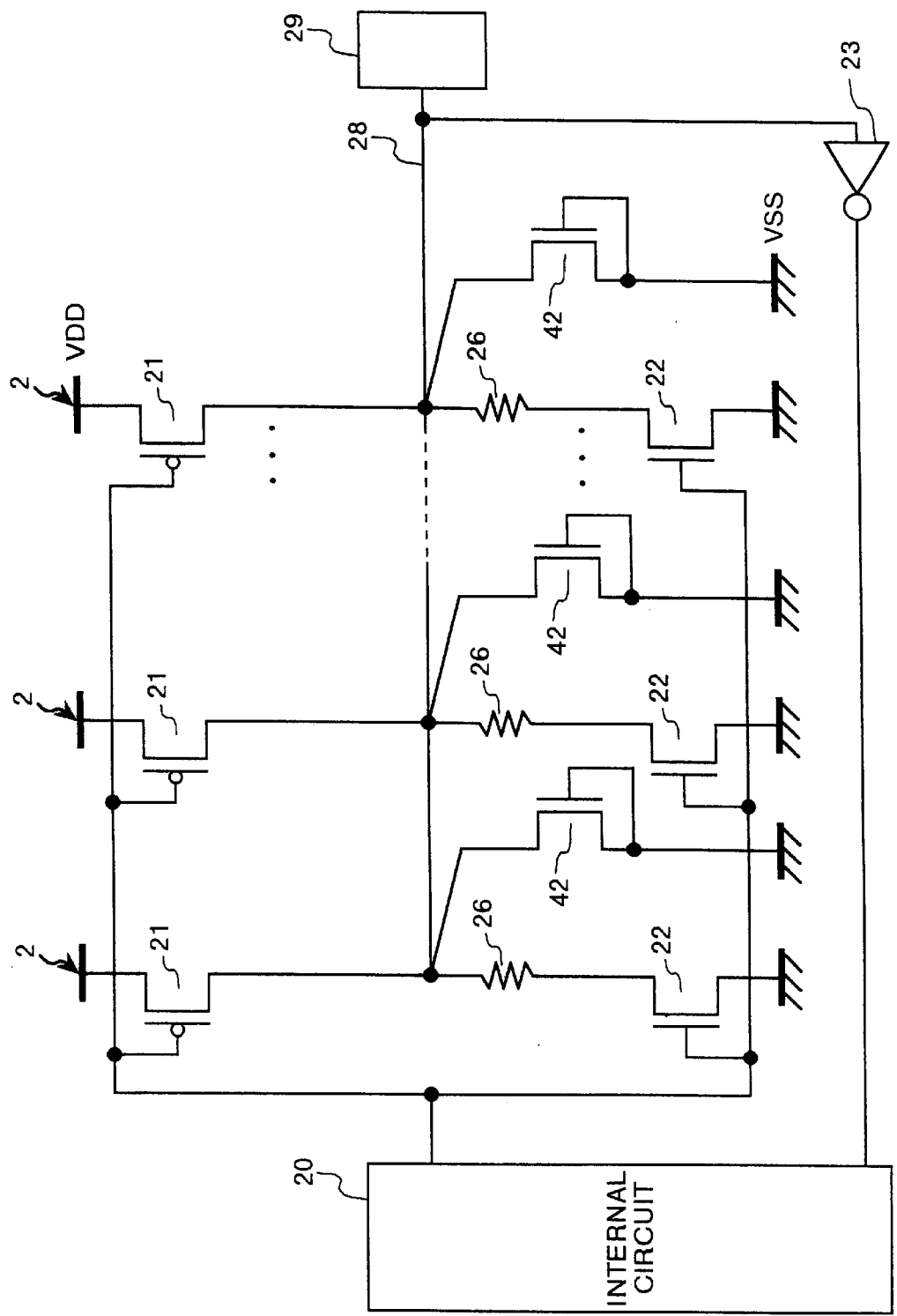
FIG. 20 is a circuit diagram showing a fourth modification example of the third embodiment.
Figure 21:
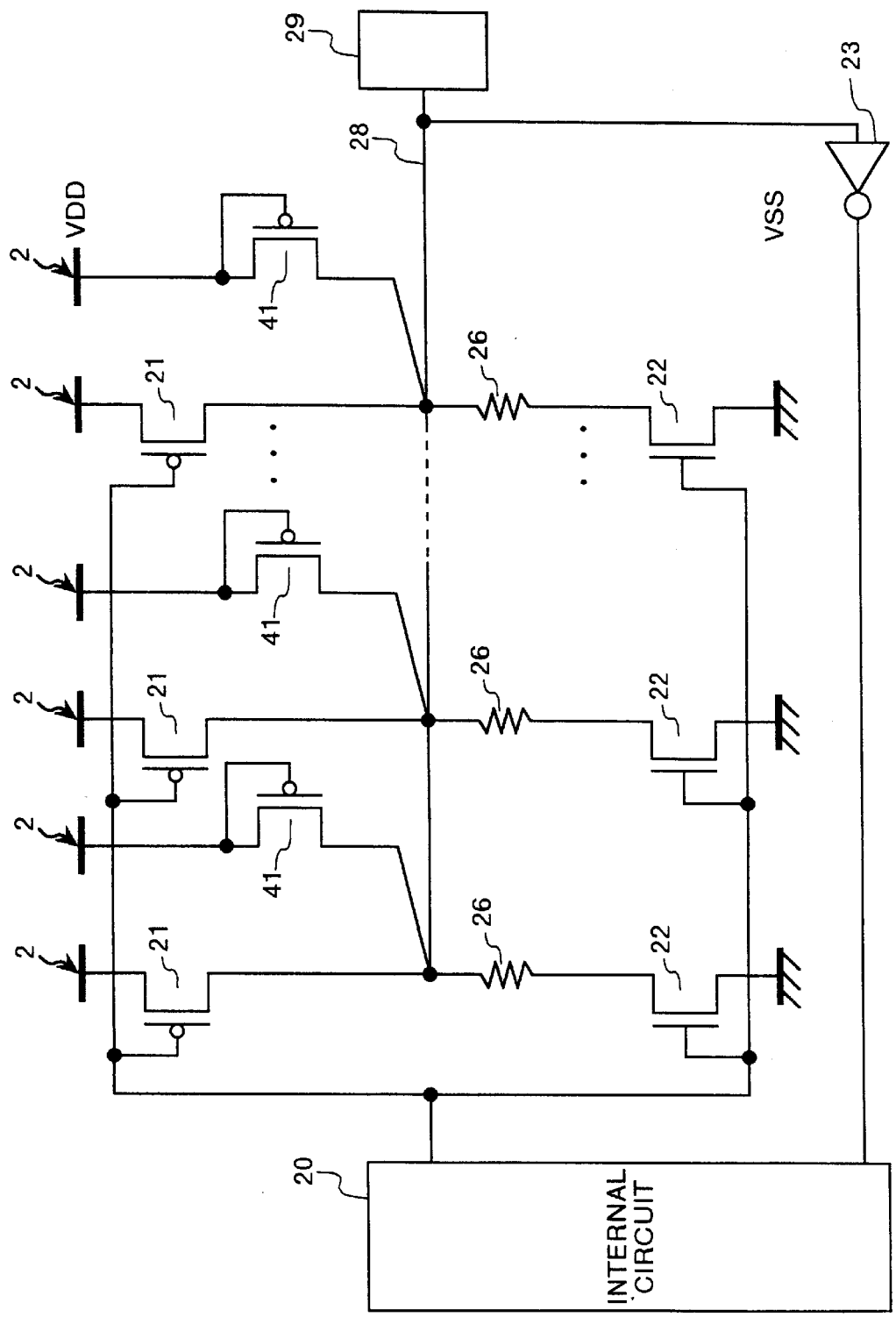
FIG. 21 is a circuit diagram showing a fifth modification example of the third embodiment.

Moreover, in the protection element array 2 having a configuration that only resistor 26 is provided on the N-channel MOS transistor 22 side, as shown in FIG. 19, the first and second field transistors 41 and 42 may be added thereto. Further, as shown in FIG. 20, the filed transistor 42 may be provided on only N-channel MOS transistor 22 side. Furthermore, as shown in FIG. 21, the field transistor 41 may be provided on only P-channel MOS transistor 21 side.

Figure 22:
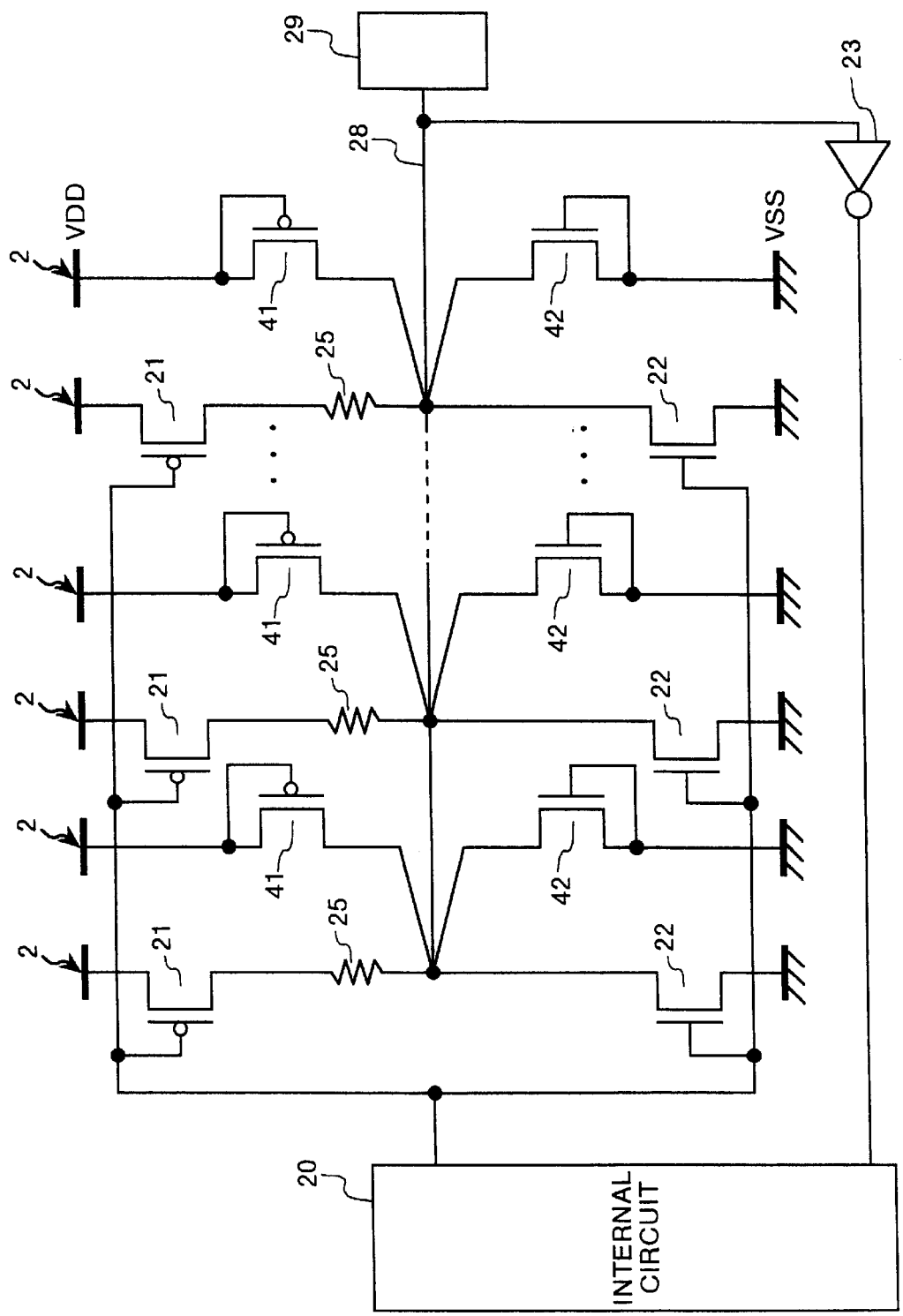
FIG. 22 is a circuit diagram showing a sixth modification example of the third embodiment.
Figure 23:
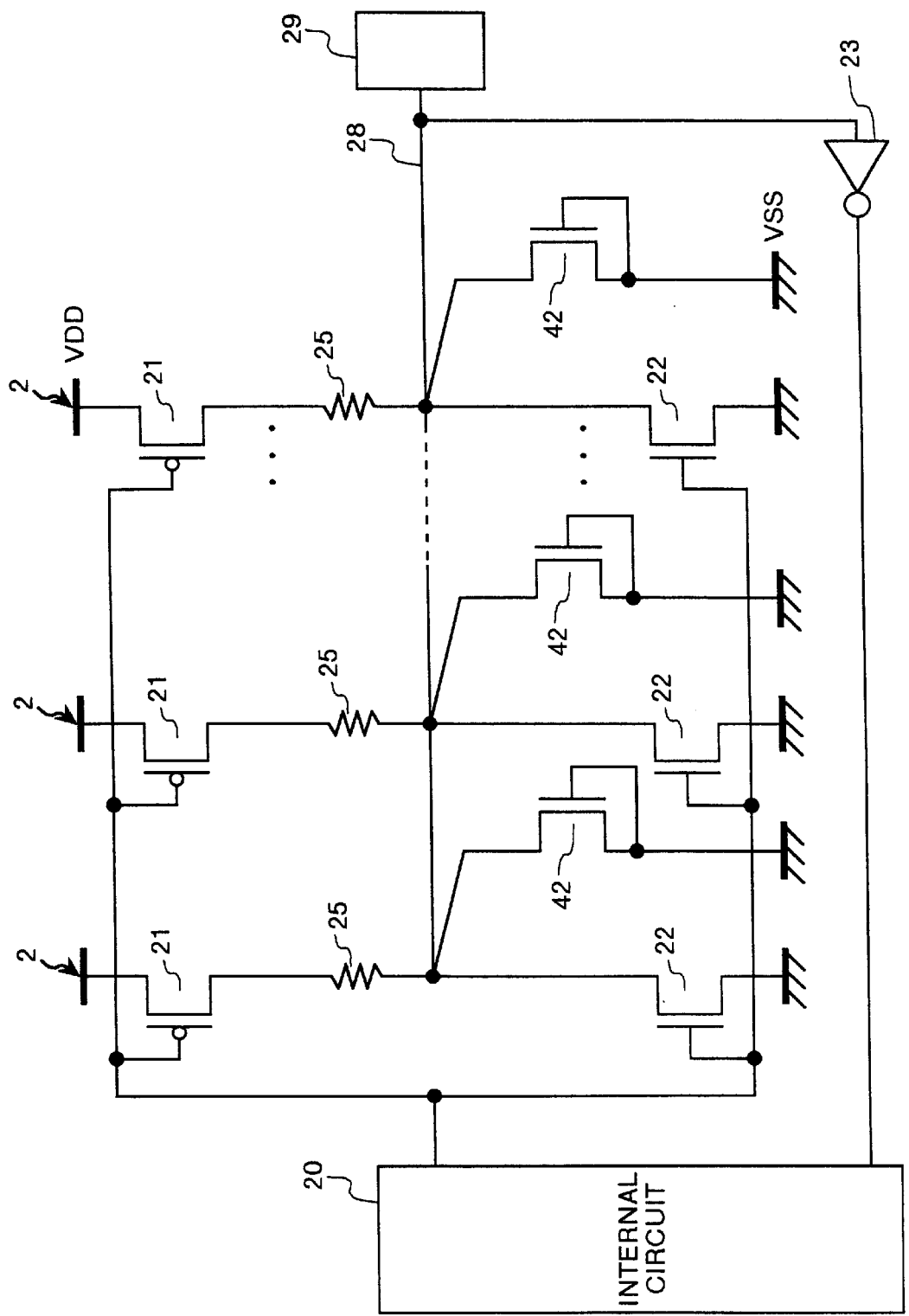
FIG. 23 is a circuit diagram showing a seventh modification example of the third embodiment.

Likewise, in the protection element array 2 having a configuration that only resistor 25 is provided on the P-channel MOS transistor 21 side, as shown in FIG. 22, the first and second field transistors 41 and 42 may be added thereto. Further, as shown in FIG. 23, the field transistor 42 may be provided on only N-channel MOS transistor 22 side. Furthermore, as shown in FIG. 24, the field transistor 41 may be provided on only P-channel MOS transistor 21 side.

In the present invention, the number of protection element arrays 2 mutually connectable in parallel is not limited to 7 arrays, and 2 to 6 arrays or 8 or more arrays may be provided.

As is evident from the above description, according to the present invention, a wiring pattern is modified in accordance with a desired driving performance, and thereby, a proper number of protection element arrays can be connected in parallel. Thus, a proper number of protection element arrays can be connected in parallel, and thereby, a plurality of the resistors included in each protection element array is connected in parallel. For this reason, even if these resistors have a resistance value enough to prevent a breakdown of MOS transistors constituting each protection element array, the protection circuit has a small resistance value as a whole. Therefore, it is possible to prevent a breakdown of MOS transistors constituting each protection element array without deteriorating output characteristics to the outside.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit having a I/O circuit for obtaining a desired driving ability by modifying a connection of a plurality of transistors comprising:
    an internal circuit;
    a pad; and
    a plurality of protection elements positioned in parallel between said internal circuit and said pad,
    wherein said protection element including,
        a P-channel MOS transistor receiving an output signal of said internal circuit and outputting a first power supply voltage level signal to said pad;
        a N-channel MOS transistor receiving an output signal of said internal circuit and outputting a second power supply voltage signal to said pad;
        a first resistor connected between a signal line connected to said pad and an output terminal of said P-channel MOS transistor; and
        a second resistor connected between said signal line and an output terminal of said N-channel MOS transistor.

2. The semiconductor integrated circuit according to claim 1, wherein each of said protection element has at least one current path for passing a current from said signal line to a first power voltage terminal.

3. The semiconductor integrated circuit according to claim 2, wherein the current path is formed of a PN junction diode, or is formed of a diode comprising a field transistor.

4. The semiconductor integrated circuit according to claim 3, wherein each of said protection element, said internal circuit, said current path and said pad are formed on the same semiconductor substrate.

5. The semiconductor integrated circuit according to claim 3, wherein said current path passes a current when a positive excessive high voltage is applied to said pad.

6. The semiconductor integrated circuit according to claim 1, wherein said first resistor and said second resistor are diffusion resistors formed on a semiconductor substrate, resistors formed of polysilicon, or well resistors formed on a semiconductor substrate.

7. The semiconductor integrated circuit according to claim 6, wherein each of said protection element, said internal circuit, said current path and said pad are formed on the same semiconductor substrate.

8. The semiconductor integrated circuit according to claim 1, wherein each of said protection element has at least one current path for passing a current from said signal line to a second power voltage terminal.

9. The semiconductor integrated circuit according to claim 8, wherein said current path passes a current when a negative excessive high voltage is applied to said pad.

10. The semiconductor integrated circuit according to claim 9, wherein each of said protection element, said internal circuit, said current path and said pad are formed on the same semiconductor substrate.

11. The semiconductor integrated circuit according to claim 10, wherein each of said protection element has at least one current path for passing a current from said signal line to a first power voltage terminal.

12. The semiconductor integrated circuit according to claim 10, wherein the current path is formed of a PN junction diode, or is formed of a diode comprising a field transistor.

13. The semiconductor integrated circuit according to claim 10, wherein said first resistor and said second resistor are diffusion resistors formed on a semiconductor substrate, resistors formed of polysilicon, or well resistors formed on a semiconductor substrate.

14. The semiconductor integrated circuit according to claim 10, wherein each of said protection element, said internal circuit, said current path and said pad are formed on the same semiconductor substrate.

15. The semiconductor integrated circuit according to claim 10, wherein each of said protection element, said internal circuit, said current path and said pad are formed on the same semiconductor substrate.

16. The semiconductor integrated circuit according to claim 10, wherein said current path passes a current when a positive excessive high voltage is applied to said pad.

17. The semiconductor integrated circuit according to claim 10, wherein each of said protection element has at least one current path for passing a current from said signal line to a second power voltage terminal.

18. The semiconductor integrated circuit according to claim 10, wherein said current path passes a current when a negative excessive high voltage is applied to said pad.

19. The semiconductor integrated circuit according to claim 8, wherein the current path is formed of a PN junction diode, or is formed of a diode comprising a field transistor.

20. The semiconductor integrated circuit according to claim 8, wherein said first resistor and said second resistor are diffusion resistors formed on a semiconductor substrate, resistors formed of polysilicon, or well resistors formed on a semiconductor substrate.

21. The semiconductor integrated circuit according to claim 20, wherein each of said protection element, said internal circuit, said current path and said pad are formed on the same semiconductor substrate.

22. The semiconductor integrated circuit according to claim 20, wherein each of said protection element has at least one current path for passing a current from said signal line to a first power voltage terminal.

23. The semiconductor integrated circuit according to claim 20, wherein the current path is formed of a PN junction diode, or is formed of a diode comprising a field transistor.

24. The semiconductor integrated circuit according to claim 20, wherein said first resistor and said second resistor are diffusion resistors formed on a semiconductor substrate, resistors formed of polysilicon, or well resistors formed on a semiconductor substrate.

25. The semiconductor integrated circuit according to claim 20, wherein each of said protection element, said internal circuit, said current path and said pad are formed on the same semiconductor substrate.

26. The semiconductor integrated circuit according to claim 20, wherein each of said protection element, said internal circuit, said current path and said pad are formed on the same semiconductor substrate.

27. The semiconductor integrated circuit according to claim 20, wherein said current path passes a current when a positive excessive high voltage is applied to said pad.

28. The semiconductor integrated circuit according to claim 20, wherein each of said protection element has at least one current path for passing a current from said signal line to a second power voltage terminal.

29. The semiconductor integrated circuit according to claim 20, wherein said current path passes a current when a negative excessive high voltage is applied to said pad.

30. A semiconductor integrated circuit having an I/O circuit for obtaining a desired driving ability by modifying a connection of a plurality of MOS transistors comprising:
   an internal circuit;
   a pad; and
   a plurality of protection elements connected in parallel between said internal circuit and said pad,
   wherein said protection element including,
      a P-channel MOS transistor receiving an output signal of said internal circuit and outputting a first power supply voltage signal to said pad;
      a N-channel MOS transistor receiving an output signal of said internal circuit and outputting a second power supply voltage signal to said pad; and
      one or both of a first resistor connected between a signal line connected to said pad and an output terminal of said P-channel MOS transistor, and a second resistor connected between said signal line connected to said pad and an output terminal of said N-channel MOS transistor.

31. A semiconductor integrated circuit having an I/O circuit for obtaining a desired driving ability by modifying a connection of a plurality of MOS transistors, comprising:
   an internal circuit;
   a pad; and
   a plurality of protection elements positioned in parallel between said internal circuit and said pad,
   wherein said protection element including,
      a P-channel MOS transistor receiving an output signal of said internal circuit and outputting a first power supply voltage signal to said pad; and
      a first resistor connected between a signal line connected to said pad and an output terminal of said P-channel MOS transistor.

32. A semiconductor integrated circuit having an I/O circuit for obtaining a desired driving ability by modifying a connection of a plurality of MOS transistors, comprising:
   an internal circuit;
   a pad; and
   a plurality of protection elements positioned in parallel between said internal circuit and said pad,
   wherein said protection element including,
      a P-channel MOS transistor receiving an output signal of said internal circuit and outputting a first power supply voltage signal to said pad;
      a N-channel MOS transistor receiving an output signal of said internal circuit and outputting a second power supply voltage signal to said pad; and
      a second resistor connected between a signal line connected to said pad and an output terminal of said N-channel MOS transistor.

* * * * *